United States Patent
Henri et al.

(10) Patent No.: US 12,249,514 B2
(45) Date of Patent: Mar. 11, 2025

(54) CARBON BASED DEPOSITIONS USED FOR CRITICAL DIMENSION CONTROL DURING HIGH ASPECT RATIO FEATURE ETCHES AND FOR FORMING PROTECTIVE LAYERS

(71) Applicant: Lam Research Corporation, Fremont, CA (US)

(72) Inventors: Jon Henri, West Linn, OR (US); Karthik S. Colinjivadi, Dublin, CA (US); Francis Sloan Roberts, Portland, OR (US); Kapu Sirish Reddy, Portland, OR (US); Samantha Siamhwa Tan, Fremont, CA (US); Shih-Ked Lee, Fremont, CA (US); Eric Hudson, Berkeley, CA (US); Todd Shroeder, Sherwood, OR (US); Jialing Yang, Sherwood, OR (US); Huifeng Zheng, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 508 days.

(21) Appl. No.: 17/439,748

(22) PCT Filed: Mar. 16, 2020

(86) PCT No.: PCT/US2020/022994
§ 371 (c)(1),
(2) Date: Sep. 15, 2021

(87) PCT Pub. No.: WO2020/190878
PCT Pub. Date: Sep. 24, 2020

(65) Prior Publication Data
US 2022/0199417 A1 Jun. 23, 2022

Related U.S. Application Data

(60) Provisional application No. 62/961,061, filed on Jan. 14, 2020, provisional application No. 62/856,595, (Continued)

(51) Int. Cl.
*H01L 21/311* (2006.01)
*H01J 37/32* (2006.01)
*H01L 21/02* (2006.01)

(52) U.S. Cl.
CPC .. *H01L 21/31116* (2013.01); *H01J 37/32935* (2013.01); *H01L 21/02115* (2013.01); (Continued)

(58) Field of Classification Search
CPC ......... H01L 21/31116; H01L 21/02115; H01L 21/30655; H01L 21/02527
See application file for complete search history.

(56) References Cited

U.S. PATENT DOCUMENTS 7,192,531 B1    3/2007   Kang et al.
9,478,468 B1 *  10/2016  Cheng ................... H01L 27/092
(Continued)

FOREIGN PATENT DOCUMENTS

JP    H10233452 A    9/1998
JP    2006523030 A   10/2006
(Continued)

OTHER PUBLICATIONS

Singapore Written Opinion from Singaporean Application No. 11202110310R dated Jun. 21, 2023.
(Continued)

*Primary Examiner* — Binh X Tran
(74) *Attorney, Agent, or Firm* — Alleman Hall & Tuttle LLP

(57) ABSTRACT

Fabricating a semiconductor substrate by (a) vertical etching a feature having sidewalls and a depth into one or more
(Continued)

layers formed on the semiconductor substrate and (b) depositing an amorphous carbon liner onto the sidewalls of the feature. Steps (a) and optionally (b) are iterated until the vertical etch feature has reached a desired depth. With each iteration of (a), the feature is vertical etched deeper into the one or more layers, while the amorphous carbon liner resists lateral etching of the sidewalls of the feature. With each optional iteration of (b), the deposited amorphous carbon liner on the sidewalls of the feature is replenished.

16 Claims, 10 Drawing Sheets

Related U.S. Application Data filed on Jun. 3, 2019, provisional application No. 62/819,936, filed on Mar. 18, 2019.

(52) U.S. Cl.
CPC ............... *H01J 2237/3321* (2013.01); *H01J 2237/3347* (2013.01)

(56) References Cited

U.S. PATENT DOCUMENTS

| | | | |
|---|---|---|---|
| 9,837,221 B2 | 12/2017 | Mclaughlin et al. | |
| 2005/0124166 A1* | 6/2005 | Krishnaraj | H01L 21/02164 257/E21.252 |
| 2007/0111373 A1* | 5/2007 | Ueda | H01L 21/0332 438/105 |
| 2007/0202657 A1* | 8/2007 | Sun | H01L 28/91 438/738 |
| 2008/0026555 A1 | 1/2008 | Dubin et al. | |
| 2010/0093187 A1 | 4/2010 | Lee et al. | |
| 2010/0327413 A1 | 12/2010 | Lee et al. | |
| 2012/0208373 A1* | 8/2012 | Padhi | C23C 16/5096 257/E21.24 |
| 2016/0163561 A1* | 6/2016 | Hudson | H01L 21/3065 156/345.24 |
| 2019/0019806 A1* | 1/2019 | Kim | H01L 21/76844 |

FOREIGN PATENT DOCUMENTS

| | | |
|---|---|---|
| JP | 2007158306 A | 6/2007 |
| JP | 2012506151 A | 3/2012 |
| JP | 2015119099 A | 6/2015 |
| JP | 2018046175 A | 3/2018 |
| TW | 201828339 A | 8/2018 |
| WO | 2004093176 A1 | 10/2004 |

OTHER PUBLICATIONS

International Search Report from International Application No. PCT/US2020/022994 dated Sep. 1, 2020.
Written Opinion from International Application No. PCT/US2020/022994 dated Sep. 1, 2020.
Japan Patent Office, Office Action Issued in Application No. 2021-556428, Mar. 5, 2024, 6 pages.
Taiwan Intellectual Property Office, Office Action and Search Report Issued in Application No. 109108883, Feb. 6, 2024, 12 pages.
Japan Patent Office, Office Action Issued in Application No. 2021-556428, Jul. 23, 2024, 4 pages.

* cited by examiner

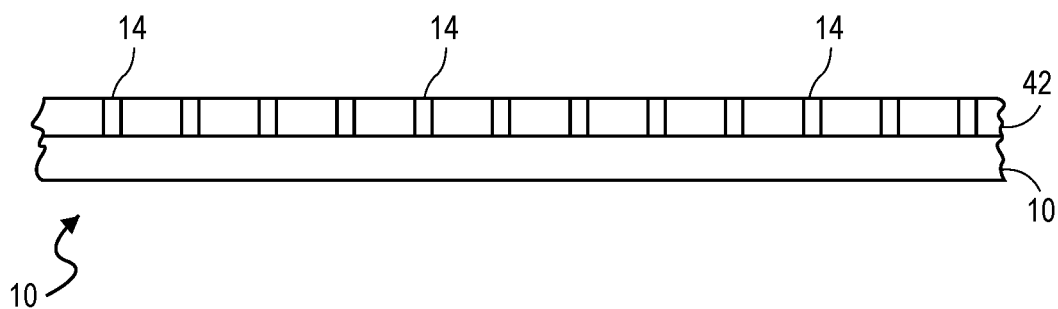
FIG. 10A
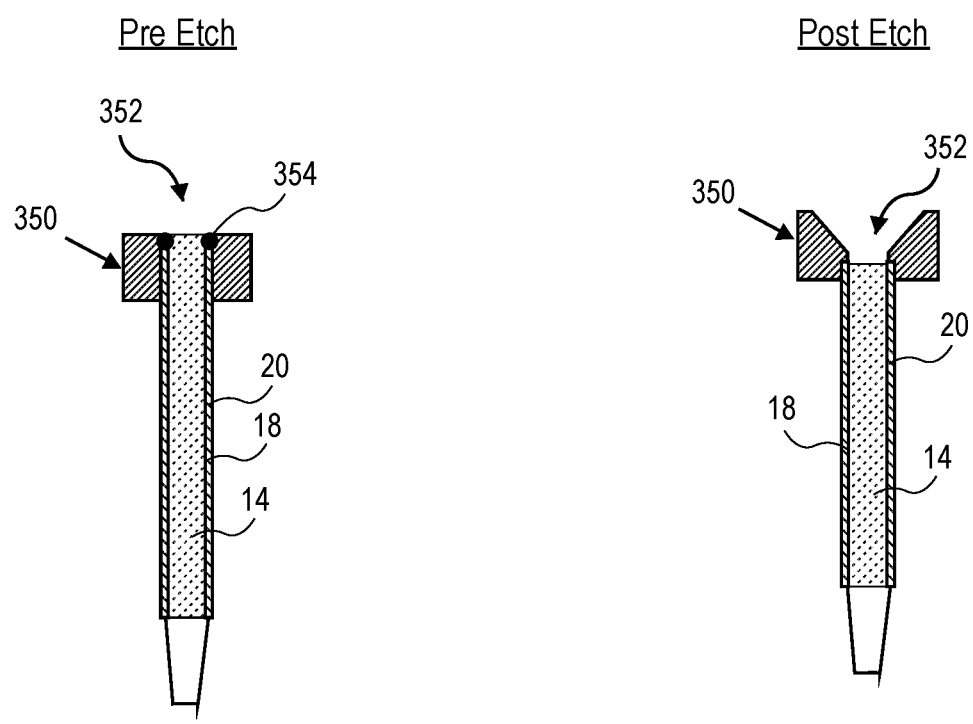
FIG. 10B  FIG. 10C

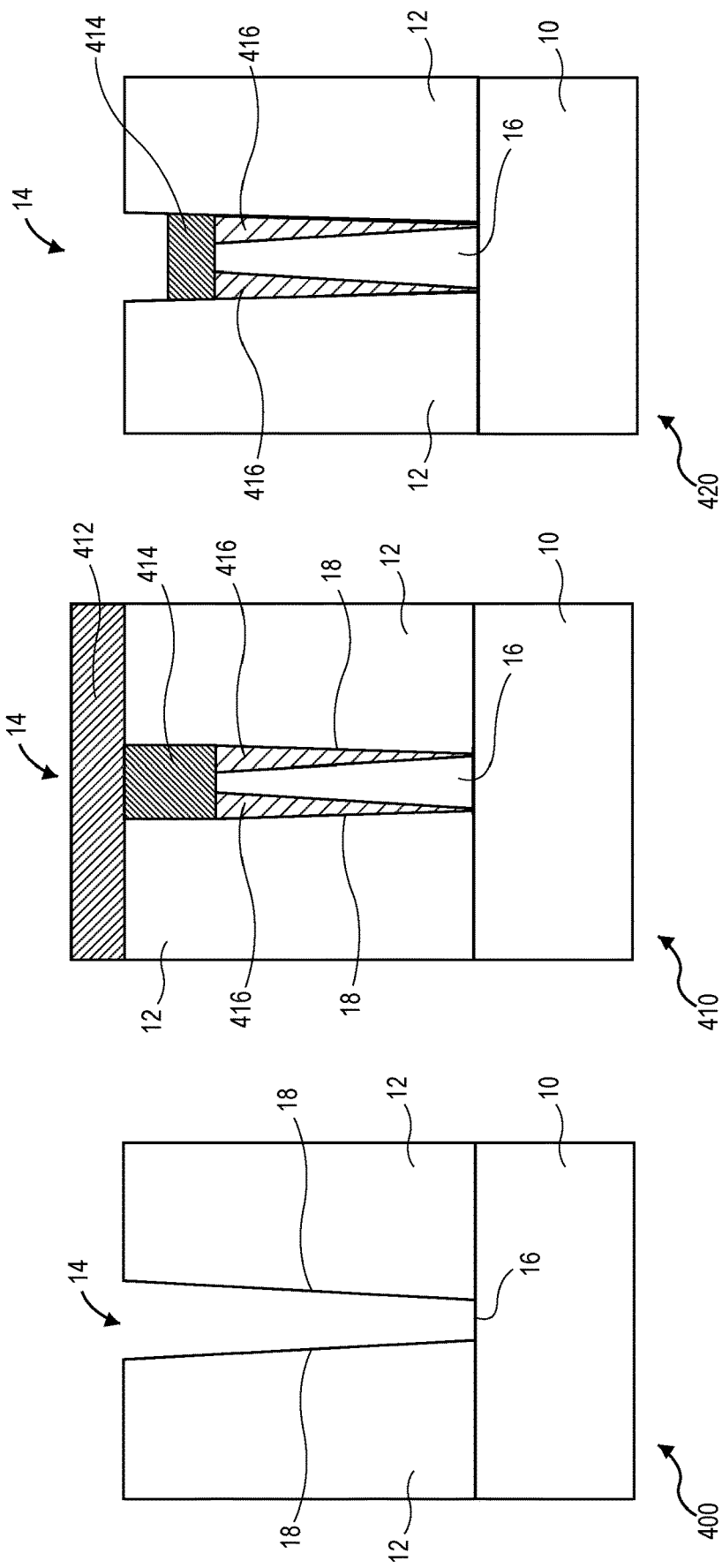

CARBON BASED DEPOSITIONS USED FOR CRITICAL DIMENSION CONTROL DURING HIGH ASPECT RATIO FEATURE ETCHES AND FOR FORMING PROTECTIVE LAYERS

CROSS REFERENCE TO RELATED APPLICATIONS

This application claims priority to U.S. provisional Application 62/819,936 entitled "CARBON BASED LINER FOR CRITICAL DIMENSION CONTROL DURING HIGH ASPECT RATIO FEATURE ETCHES" filed Mar. 18, 2019, U.S. Provisional Application 62/856,595, entitled "CARBON BASED LINER FOR CRITICAL DIMENSION CONTROL DURING HIGH ASPECT RATIO FEATURE ETCHES", filed Jun. 3, 2019 and U.S. Provisional Application 62/961,061, entitled "CARBON BASED DEPOSITIONS USED FOR CRITICAL DIMENSION CONTROL DURING HIGH ASPECT RATIO FEATURE ETCHES AND FOR FORMING PROTECTIVE LAYERS", filed Jan. 14, 2020. Each of these priority applications are incorporated herein by reference for all purposes.

FIELD OF THE INVENTION

The present application is directed to semiconductors, and more particularly, to a process for fabricating very high aspect ratio features, with tight Critical Dimension ("CD") control, by depositing a highly etch resistant, amorphous, carbon film onto sidewalls of the features using Plasma Enhanced Chemical Vapor Deposition (PECVD). The present invention also relates to various techniques for preventing excess amorphous carbon liner material from depositing within the holes and sidewalls defining the features, preventing or at least delaying "pinch off" conditions from occurring, which allows an etch to deepen the features to occur for a longer period of time before the amorphous carbon film on the sidewalls is depleted, while maintaining tight CD control. This application is also directed to using amorphous carbon as a sacrificial material that is used to protect vertically etched features during subsequent processing steps to fabricate other features.

DESCRIPTION OF RELATED ART

Fabrication of certain semiconductor devices often involves vertical etching features into a layer or a stack of layers of various materials. The various materials may include, but are not limited to, silicon nitride, silicon oxide, polysilicon, boron doped oxides, and/or other oxides.

The features that are commonly vertically etched into a single layer or a stack of layers may widely vary in shape. Common features typically include, but are not limited to, cylinders, holes, trenches, slits and other geometric or non-geometric shapes.

The aspect ratio of a given vertical etched feature is defined by its depth divided by its width. A high aspect ratio cylinder, for example, is characterized by a small diameter (i.e., width) relative to a deep depth. A high aspect ratio trench is similarly defined as having a deep depth and a narrow side-wall to side-wall width.

With certain types of semiconductor devices, the fabrication of high aspect ratio features is critical. With 3D NAND memory devices for instance, it is desirable to fabricate cylinders, trenches and other features having very high aspect ratios that span in depth multiple stacked layers on the device. With current fabrication processes, however, fabricating extremely high aspect ratio features is difficult.

During a deep vertical etch, the side walls of a feature are unavoidably etched. This lateral etch undesirably increases the width of the feature, decreases the aspect ratio, as well as causing the sidewalls to twist and/or bow. The degree of lateral etching, twisting, and/or bowing is characterized by the Critical Dimension or "CD" measure of the feature.

To improve the CD measure, the use of a lateral etch barrier or "liner" on the sidewalls of a feature is known. These sidewall liners are typically either a metal-based material (e.g., tungsten carbide or "WC") or a carbon-based polymer that acts as a barrier to mitigate lateral etching during vertical etching. While these liners work to a degree, they have some drawbacks. If the liner material is highly resistant to the fluorine, chlorine, and/or bromine-based etch chemistries, the liner material may interact with the vertical etch process, causing a number of negative consequences. These negative consequences include undesirable, uneven, rough vertical grooves in the sidewalls caused by striations and kinking, an uneven re-entrant profile, and irregularities in the hole on the planar surface of the layer or stack of layers in which the feature is vertical etched. If the liner material is not highly resistant to the etch chemistries, the protection against bowing may be insufficient or inadequate.

The above issues are problematic for several reasons. First, with potentially insufficient insulation between features due to bowing, electrical shorting may occur. Second, to avoid the possibility of electrical shorting, it is prudent to space the features farther apart from one another than is typically desired. As a result, certain semiconductor devices are less dense than they possibly could be for a given process technology. Third, the surface irregularities of the entrant hole, on the sidewalls and at the bottom of features, provide poor contact surfaces and make it more difficult to deposit other films into the features.

Conventional metal-based or carbon-based polymer liners are therefore inadequate when pushing the boundary for vertical etching high aspect ratio features. For next generation process technologies, a new process for fabricating deep features in semiconductor structures having extremely high aspect ratios and tight critical dimension (CD) control is needed.

SUMMARY

The present application is directed to a semiconductor process for fabricating deep features having extremely high aspect ratios and tight critical dimension control (CD).

In one non-exclusive embodiment, the invention is directed to a method of fabricating a semiconductor substrate including (a) vertical etching a feature having sidewalls and a depth into one or more layers formed on the semiconductor substrate and (b) depositing an amorphous carbon liner onto the sidewalls of the feature.

The invention is further directed to, in certain non-exclusive embodiments, iterating (a) and optionally (b), until the feature has reached a desired depth. With each iteration of (a), the feature is vertical etched deeper into the one or more layers, while the amorphous carbon liner resists lateral vertical etching of the sidewalls of the feature. With each optional iteration of (b), the deposited amorphous carbon liner on the sidewalls of the feature is replenished.

The use of an amorphous carbon liner is advantageous for a number of reasons. Amorphous carbon is highly resistant to the fluorine, chlorine, and/or bromine chemistries that are commonly used for the vertical etching of features. With an amorphous carbon liner on the sidewalls, laterally etching is significantly mitigated or eliminated. In addition, the deposition process can be readily controlled, meaning the amorphous carbon liner can be tailored to meet specific desired specifications, such as material thickness, uniformity, composition, conformality, etc. As a result:

(1) Lateral etching is minimized during vertical etching, preventing bowing of the sidewalls and/or surface irregularities of the hole on the top surface of the one or more layers defining the feature;

(2) Issues of striations, kinking, uneven, rough, vertical surfaces, grooves and other surface irregularities in the sidewalls are mitigated or altogether eliminated; and (3) Highly dense, deep, features, with extremely high aspect ratios, and tight CD control, suitable for next generation process technologies and semiconductor devices, can be achieved.

In certain optional embodiments, other etches may be performed as well. For instance, after a vertical etch to either nominally create or deepen a feature, a conformality etch may be performed with the objective of creating a more desirable CD profile at or near the top of the vertically etched feature. An optional etch-back may also be performed after a deposition step to remove incidental deposit of the amorphous carbon that may occur at the opening and/or on the sidewalls of the vertical feature.

In yet another embodiment, an etch of the amorphous carbon material depositing in the hole defining the feature and upper regions of the sidewalls of the feature is performed at least partially simultaneously with the deposition of the amorphous carbon material used to form the liner on the sidewalls of the feature. By performing the simultaneous etch, "pinch off" caused by excess amorphous carbon material collecting in the opening defining the feature is either delayed or prevented from occurring altogether during the deposition. In addition, the simultaneous etch results in the liner on the sidewalls having a more uniform thickness from top to bottom. With a more uniform thickness, a subsequent etch to deepen the feature can be extended for a longer period of time, before the liner is depleted, while still maintaining tight CD control.

In yet another embodiment, a mask defining an opening of a feature formed in a semiconductor substrate is patterned and excess deposit material from the opening is removed, again to prevent pinch off conditions. With this embodiment, the semiconductor substrate is fabricated by (a) vertically etching a feature having an opening, sidewalls and a depth into the semiconductor substrate, (b) depositing a liner material onto the sidewalls of the feature and (c) performing a mask-shaping etch of a carbon mask used to pattern or define the opening of the feature. The mask-shaping etch (i) "gently" shapes the carbon mask in the vicinity of the opening of the feature and (ii) removes excess deposits of the liner material that may have collected in the opening of the feature, both of which facilitate subsequent iterations of (a) and (b) that may be performed to deepen the feature and increase its aspect ratio.

In non-exclusive embodiments, (a), (b) and (c) are iterated two or more times until the feature has reached a desired depth. In yet another non-exclusive embodiment, the mask is shaped so as to be tapered from wide to narrow in the direction toward the feature. In yet another embodiment, amorphous carbon is used as the liner material on the sidewalls of the feature.

By shaping the mask and removing the unwanted material from the opening, at least the following advantages are realized; (1) with a wide opening defined by the tapered mask, it is easier for deposition material and etchant chemistries to flow and diffused downward into the depths of the feature and (2) "pinch off" conditions, caused by an excess of the deposition material in the opening, is mitigated or altogether eliminated.

By shaping the mask, removing excess material from the opening, and using an amorphous carbon liner, lateral etching is minimized during vertical etching and striations, kinking, uneven, rough, vertical surfaces, bowing, grooves and other surface irregularities in the sidewalls and/or opening of the feature are all mitigated. As a result, highly dense, very deep features with extremely high aspect ratios and tight CD control can be fabricated.

In yet other embodiments, the deposition of amorphous carbon can be used as a sacrificial protective material after a vertically etched feature having extremely high aspect ratios and tight critical dimension control (CD) is fabricated. With certain types of semiconductor substrates, such as 3D NAND devices, other structures, thin films and/or layers can be constructed above an already fabricated vertically etched feature. By either partially or completely filling the vertically etched feature, it can be protected during the fabrication of the above-lying films, layers and/or features. In various embodiments, non-conformal amorphous carbon material can be deposited on the sidewalls of the feature, the opening defining the feature can be filled with an amorphous carbon "plug", or the entire feature can be covered with amorphous carbon. The amorphous carbon, once deposited, can be etched back and/or removed entirely using a chemical etch using for example oxygen, hydrogen or fluorine based etch.

In yet other embodiments, the above described depositions and etching are performed in a single substrate processing tool with the ability to perform both depositions and etching. In alternative embodiments, the depositions and etchings can be performed in a single tool having separate deposition and etching processing chambers, or in two separate deposition and etching tools. In the later two embodiments, substrates need to be transported between the different processing chambers.

In yet additional embodiments, the deposition of amorphous carbon and the etching back of the deposited amorphous carbon occurs substantially simultaneously in the same processing chamber. In various embodiments, the deposition of the amorphous carbon is accomplished by introducing one or more carbon containing precursors into the processing chamber and then generating a plasma within the chamber, Such carbon containing precursors include, but are not limited to, hydrocarbons such as propylene, acetylene, methane, toluene and/or other hydrocarbon (CxHy) chemistries. The simultaneous etch is preferably, although not necessarily, a chemical etch. In non-exclusive embodiments, the etch is performed by simultaneously introducing an etchant gas into the processing chamber during the deposition, such as nitrous oxide ($N_2O$), carbon dioxide ($CO_2$), hydrogen ($H_2$), sulfur hexafluoride ($SF_6$), oxygen ($O_2$), or other oxygen containing species or a combination thereof. Also, other diluents can be introduced into the chamber, such as inert gases, including but not limited to nitrogen ($N_2$), helium (He), and/or argon (Ar), for controlling the deposition rate of the amorphous carbon. For example, by using relatively high concentration levels of diluents, the deposition rate can be minimized. By dialing down or altogether eliminating the diluents, the deposition rate can be increased. Thus, in situations where minimal to no deposition is desired, such as during a simultaneous deposition and etch to form a vertical etch feature having a high aspect ratio and a tight CD dimension, then higher concentration levels of a diluents is used. On the other hand where the objective is to increase the deposition rate of the amorphous carbon, such as when forming sacrificial plugs and/or sacrificial non-conformal amorphous carbon on sidewalls, then lower or even no diluents may be used. Thus by adjusting the concentration levels of the diluents, such as inert gases, including but not limited to nitrogen ($N_2$), helium (He), and/or argon (Ar), the deposition rate of the amorphous carbon can be controlled to meet a wide variety of different objectives.

BRIEF DESCRIPTION OF THE DRAWINGS

The present application and the advantages thereof, may best be understood by reference to the following description taken in conjunction with the accompanying drawings in which:

FIG. 10A illustrates an exemplary semiconductor substrate with multiple features formed therein in accordance with a non-exclusive embodiment of the invention.

FIGS. 10B and 10C show a pre and a post etch for shaping an opening of a feature in accordance with a non-exclusive embodiment of the invention.

FIG. 11 shows an exemplary vertically etched feature with very high aspect ratios and very tight CD control fabricated in a semiconductor substrate in accordance with the non-exclusive embodiments of the present invention.

FIG. 12 and FIG. 13 illustrate a protective sacrificial layer and plug for protecting an exemplary vertically etched feature during subsequent processing in accordance with non-exclusive embodiments of the invention.

In the drawings, like reference numerals are sometimes used to designate like structural elements. It should also be appreciated that the depictions in the Figures are diagrammatic and not necessarily to scale.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

The present application is directed to a semiconductor process for fabricating deep features having extremely high aspect ratios and tight critical dimension control (CD). In one non-exclusive embodiment, the invention is directed to a method of fabricating a semiconductor substrate including (a) vertical etching a feature having sidewalls and a depth into one or more layers formed on the semiconductor substrate and (b) depositing an amorphous carbon liner onto the sidewalls of the feature.

The invention further is directed to, in certain non-exclusive embodiments, iterating (a) and optionally (b), until the vertical etch feature has reached a desired depth. With each iteration of (a), the feature is vertical etched deeper into the one or more layers, while the amorphous carbon liner resists lateral etching of the sidewalls of the feature. With each optional iteration of (b), the deposited amorphous carbon liner on the sidewalls of the feature is replenished.

Process Flow Diagram

Figure 1:
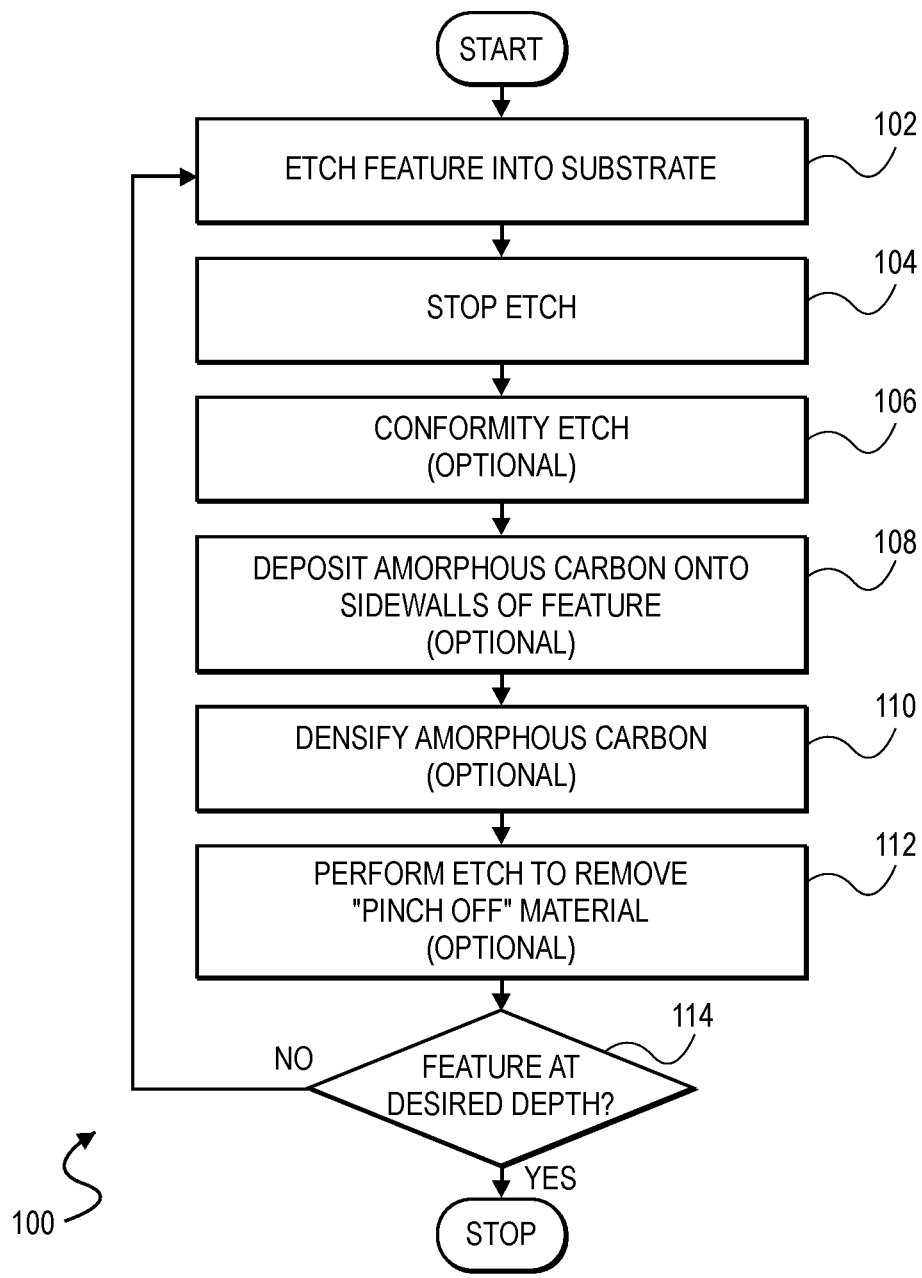
FIG. 1 is a flow diagram illustrating processing steps for fabricating one or more features on a semiconductor substrate in accordance with a non-exclusive embodiment of the present invention.

Referring to FIG. 1, a flow diagram 100 illustrating the iteration of the processing steps (a) and (b) as defined above for fabricating one or more vertical etched features in one or more layers formed on a semiconductor substrate is shown.

In initial step 102, a nominal or "starter" vertical etch is performed to create one or more features on the semiconductor substrate.

In step 104, the nominal vertical etch is stopped. In a non-exclusive embodiment, the depth of the nominal vertical etch is in the range of 3 to 4 microns. It should be understood that this range is merely exemplary. A nominal vertical etch that is either deeper or less deep may be performed.

In an optional step 106, a conformity etch is performed. The objective of the conformity etch is to open and/or control the CD of the one or more holes defining the one or more vertical features etched into the semiconductor substrate. By opening and/or controlling the CD of the hole(s), the upper sidewall regions of the features are prevented from becoming closed off, preventing a condition known as "capping" from occurring. If a given hole becomes closed off or is too small, it may become clogged, "capping" the top of the feature with polymer material during a subsequent vertical etch. Also, by opening and/or controlling the CD of the holes of the features 14, the subsequent deposition of amorphous carbon will tend to be more conformal. The conformity etch may be performed using a number of different chemistries, including but not limited oxygen ($O_2$), nitrous oxide ($N_2O$), carbon dioxide ($CO_2$), hydrogen ($H_2$), and/or any other inert gas, or any mixture or combination thereof.

In step 108, the amorphous carbon liner is deposited on the sidewalls of the one or more features, generally extending from the top of the opening down to the bottom depth of the one or more features. In various embodiments, the thickness of the amorphous carbon liner ranges from 5 to 500 Angstroms. It should be understood that this range is merely exemplary. The amorphous carbon liner can be made either thinner or thicker.

In optional step 110, the deposited amorphous carbon liner is "densified". By making the amorphous carbon liner more dense, it extends its useful life before replenishing is needed. The densifying of the amorphous carbon liner can be accomplished by compacting the amorphous carbon liner, purging hydrogen from the amorphous carbon liner or a combination of both. For example, by exposing the semiconductor substrate to a Radio Frequency (RF) plasma with an inert plasma chemistry (e.g., argon, dinitrogen, helium, etc.) or a hydrogen plasma, the amorphous carbon liner can be compacted and hydrogen removed, both of which result in densification.

In another optional step 112, an etch-back is performed to remove excessive amorphous carbon that may deposit (i) on the planar surface of the one or more layers around or adjacent to the hole(s) defining the one or more features and (ii) on the sidewalls of the one or more features. By removing these excess deposits, "pinch off" conditions are avoided that may partially or fully block or close the width of a given feature. If pinch off occurs, the chemistry in a subsequent vertical etch may be prevented from reaching the depth of the features, inhibiting the vertical etch. Also, with the ability to remove any excess deposition material from sidewalls, a final feature with improve the CD tightness typically results. The etch back may be performed using a number of different chemistries, including but not limited to those including oxygen ($O_2$), nitrous oxide ($N_2O$), carbon dioxide ($CO_2$), Hydrogen ($H_2$), nitrogen ($N_2$), or any mixture or combination thereof.

In step 114, it is determined if the feature has been vertical etched to its desired depth. If yes, then the above-described process is complete. If not, the above steps 102-112 are repeated, including the vertical etch start and stop steps 102, 104, and any of the optional steps 106-112.

With each iteration of the vertical etch step 102, a number of factors may be considered before stopping the vertical etch in step 104. One significant factor is the condition of the amorphous carbon liner. While amorphous carbon is generally highly resistant to fluorine, chlorine and/or bromine, it is not entirely impervious to these etching chemistries. Factors such as the thickness of the amorphous carbon liner, the lateral etch rate of the amorphous carbon liner versus the rate at which the feature is vertically etched and other criteria can all be used to determine when to stop a vertical etch and to replenish the amorphous carbon liner. With very deep features (e.g., of 4 microns of depth or more), multiple iterations of (a) vertical etchings and (b) depositions may be required.

It is noted that the step 108 is listed as "optional". As a general rule, the amorphous carbon liner is deposited almost always following the nominal first vertical etch. This way, the sidewalls of the one or more features are subject to minimal laterally etching during a subsequent vertically etching step (a). At some point, after one or more iterative vertical etching(s) (a), the feature(s) reach their desired vertical depth. When this occurs, replenishing the amorphous carbon liner may be unnecessary or undesirable. In which case, the deposition step 108 may optionally skipped.

Semiconductor Substrate with Vertically Etched Features

Figure 2:
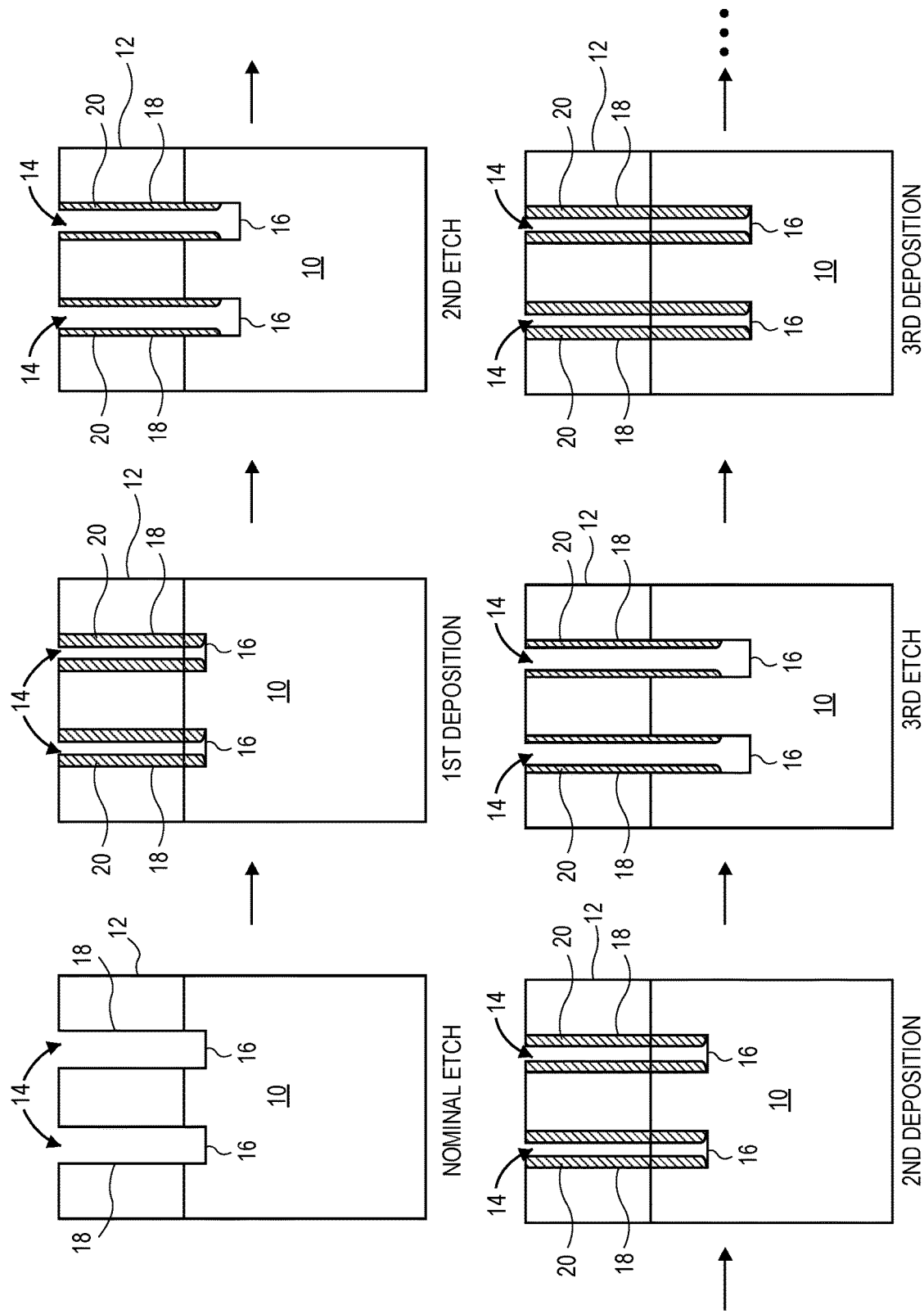
FIG. 2 illustrates several iterations of an (a) vertical etch followed by (b) an amorphous carbon liner deposition during fabrication of one or more features on the semiconductor substrate in accordance with a non-exclusive embodiment of the invention.

Referring to FIG. 2, several iterations of an (a) vertical etch followed by (b) an amorphous carbon deposition liner during fabrication of one or more features on an exemplary semiconductor substrate is shown. The fabrication of the features on the semiconductor device generally follows the steps outlined above with regard to the flow diagram of FIG. 1. In this particular example, three (3) iterations of (a) and (b) are performed for the features to reach their desired depth.

The semiconductor substrate 10 includes one or more layers 12. In a nominal or "starter" vertical etch, two features 14 defined by a depth 16 and sidewalls 18 are fabricated as shown. For the sake of clarity, a vertical etch is intended to be broadly construed to include any etch that is mostly into the depth the substrate 10 and/or any layers 12. It should be understood, however, that with certain vertical etches, it is possible that some degree of etching in the horizontal direction may also occur as well.

In a subsequent first deposition, amorphous carbon liners 20 are formed on the sidewalls 18 of the features 14. The amorphous carbon liners 20 typically extend down to the bottom or near the bottom of the depth 16 of the features 14.

The substrate 10 next undergoes a second vertical etch to extend the depth 16 of the features 14. With the second vertical etch, the amorphous carbon liners 20 no longer reach the bottom depth 16 of the features 14.

In a second deposition, amorphous carbon liners 20 are replenished and extend down to near or at the bottom of the depth 16 of the features 14 as defined by the second vertical etch.

In a third iteration, the features 14 are again vertical etched. In this particular example, the depth 16 after the third vertical etch reaches the desired or target depth. Accordingly, no more vertical etch iterations are required in this example.

In an optional third deposition, the amorphous carbon liners 20 are again replenished. It is noted that this step is optional and may not be implemented as described above.

Although not illustrated in FIG. 2, any of the optional steps may be implemented, including the conformity etch 106, densifying step 110 and/or etch-back 112. In some embodiments, these steps can be performed with each iteration of (a) and (b). In other embodiments, these steps can be performed with some, but not all of the iterations (a) and/or (b).

It is pointed out that with the second and third iterations, the amorphous carbon liner 20 is shown thicker after a replenishment (b) compared to immediately following each vertical etch (a). It should be understood the diagrams are merely illustrative and are not drawn to scale. With a thickness of the amorphous carbon liners 20 typically in the range of a few angstroms, drawings that are to scale are not plausible.

Only three iterations of (a) vertical etching and (b) deposition have been described and illustrated. It should be understood that any number of iterations may be used. In some cases, fewer iterations may be needed to reach a desired depth 16 of the features 14, while in other cases, more iterations are needed.

Ascertaining the number of iterations of (a) and (b) needed for a given feature 14 is dependent on a wide variety of factors. Such factors may include, but are by no means limited to, the desired depth of the feature, the thickness of the deposited amorphous carbon liner 20, the Critical Dimension (CD) tolerance for the feature 14, a desired aspect ratio of the feature 14, timing when the amorphous carbon liner 20 needs to be replenished and/or any combination thereof. It should be understood that this list of factors is not exhaustive and that others may also be considered.

For the sake of simplicity, just one layer 12 is shown. It should be understood that the layer 12 can include multiple stacked layers. The individual layer or layers 12 of the semiconductor substrate 10 may widely vary. Such layer(s) may include, but are not limited to silicon nitride, silicon oxide, polysilicon, an oxide, a doped oxide such as boron doped oxide, various spin-on glass materials such as PSG and BPSG, or any other type of material or layer that is formed on semiconductor substrates, including those that are currently known or used and those that are discovered or used in the future. It should therefore be understood that this list of materials is not exhaustive and that features 14 may be vertical etched into any type of layer or layers of other material(s) other than those specifically listed herein.

It should also be understood that the feature 14 can assume a wide variety of shapes. Such shapes may include, but are not limited to, a cylinder, a hole, a trench, a slit, a geometric shape, a non-geometric shape, or just about any other shape that can possibly be fabricated on a semiconductor substrate, such as semiconductor substrate 10.

It is also noted, that in some embodiments, the amorphous carbon liner 20 deposited on the sidewalls 18 of the vertical etched features 14 may possibly be removed during subsequent processing steps of the semiconductor substrate 10. For example, the amorphous carbon liner 20 can be removed during an "ashing" step, which is typically an isotropic etch step.

Substrate Processing Tools

As detailed above, the above-described process involves at least two process steps, including (a) vertical etching the features 14 into the one or more layers 12 of the semiconductor substrate 10 and (b) depositing the amorphous carbon liner 20 onto the sidewalls 18 of the features 14. In various embodiments, these two processes (a) and (b) can be implemented in separate etching and deposition tools, or alternatively, in a tool capable of both (a) and (b) in situ.

Figure 3:
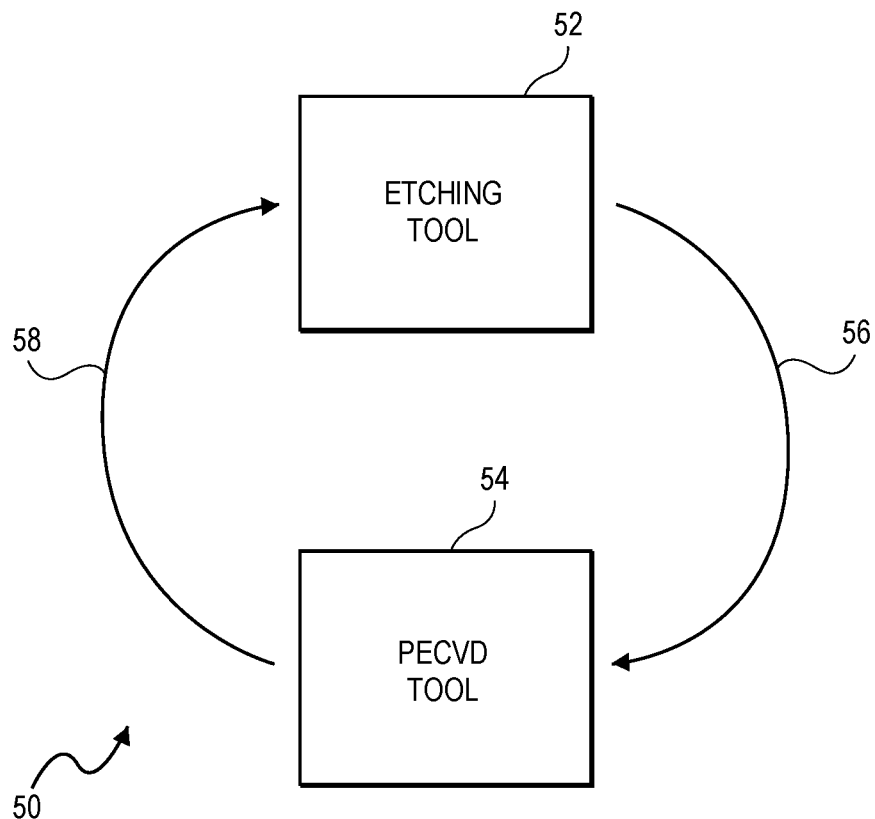
FIG. 3 is a diagram illustrating the iterative processing of (a) vertical etching and (b) deposition of the amorphous carbon liner using separate etching and Plasma Enhanced Chemical Vapor Deposition (PECVD) tools in accordance with a non-exclusive embodiment of the invention.

FIG. 3 is a diagram 50 illustrating the iterative processing steps of (a) vertical etching and (b) and deposition of the amorphous carbon liner 20 using two separate tools is illustrated.

In this embodiment, a separate plasma-etching tool 52 is used to perform the one or more vertical etching steps (a) of the feature 14 in the one or more layers 12 on a semiconductor substrate 10. A separate deposition tool, such as a Plasma Enhanced Chemical Vapor Deposition Tool (PECVD) 54, is used to perform the one or more iterations of the (b) deposition of the amorphous carbon liner 20.

The circular arrows 56, 58 are intended to show the iterative nature of the above described process. In other words, after a semiconductor substrate 10 has been vertical etched, it is removed from tool 52 and transported to the PECVD tool 54. After deposition of the amorphous carbon liner 20, the semiconductor substrate 10 is then transported back to the etching tool 52. The above process may be iterated multiple times, as discussed above, until the feature 14 has reached its desired final depth 16. In various embodiments, commercially available tools may be used such as the Kiyo or Flex etch tools and/or the Altus or Reliant deposition tools commercially offered by the assignee of the present application.

Figure 4:
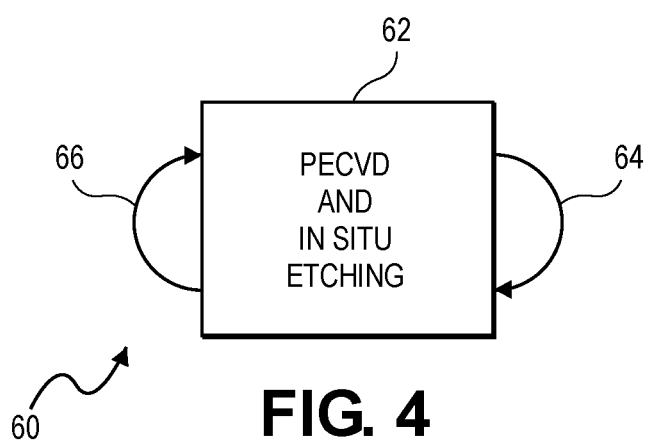
FIG. 4 is a diagram illustrating the iterative processing of (a) etching and (b) deposition of the amorphous carbon liner in situ a single tool in accordance with a non-exclusive embodiment of the invention.

Referring to FIG. 4, a diagram 60 illustrating a single PECVD tool 62 with the ability to perform in situ both the vertical etch (a) on the semiconductor substrate 10 and (b) the deposition of the amorphous carbon liner 20 is illustrated. With this embodiment, the iterative steps of (a) and (b) are performed in one tool, as signified by the arrows 64 and 66, eliminating the need to transport the semiconductor substrate 10 between multiple tools. By using a single tool 62, the throughput of processing of multiple substrates 10 can likely be increased compared to using multiple tools.

A tool capable of performing both (a) and (b) can be implemented by either (1) modifying an existing etch tool (2) modifying a Plasma Enhanced Chemical Vapor Deposition (PECVD) tool or (3) designing and building a new tool from scratch.

It is further noted that the above described optional steps of densifying the amorphous carbon liner 20 and/or the etch-back and the conformity etch can each be performed in any of the tools 52, 54 and/or 62.

Exemplary PECVD Tool

Figure 5:
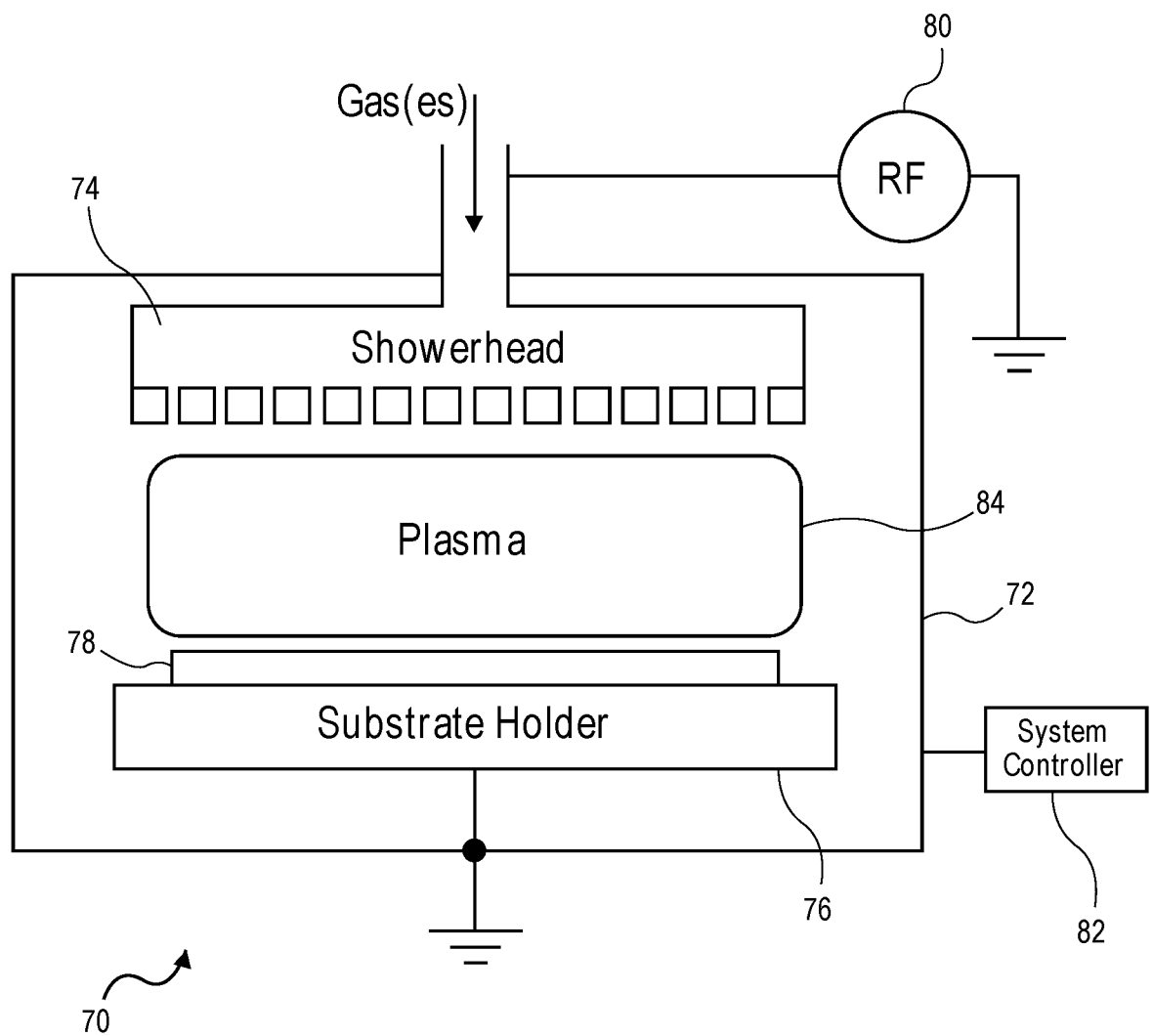
FIG. 5 is a diagram of an exemplary PECVD tool that could be used for the (b) deposition of the amorphous carbon liner in accordance with a non-exclusive embodiment of the invention.

FIG. 5 is a diagram of an exemplary PECVD tool 70 that could be used for the deposition of the amorphous carbon liner 20 onto the sidewalls 18 of the features 14 of the semiconductor substrate 10 in accordance with a non-exclusive embodiment of the invention.

The CVD tool 70 includes a processing chamber 72, a shower head 74, a substrate holder 76 for holding and positioning a semiconductor substrate 10 to be processed, a Radio Frequency (RF) generator 80, and a system controller 82.

During operation, reactant gas(es) are supplied into the process chamber 72 through the shower head 74. Within the shower head 74, the gas(es) is/are distributed via one or more plenums (not illustrated) into the chamber 72, in the general area above the surface of the semiconductor substrate 10 to be processed. An RF potential, generated by the RF generator 80, is applied to an electrode (not illustrated) on the shower head 74. (An RF potential may also possibly be applied via an electrode, also not shown, provided on to the substrate holder 76.) The RF potential generates a plasma 84 within the processing chamber 72. Within the plasma 84, energized electrons ionize or dissociate (i.e., "crack") from the reactant gas(es), creating chemically reactive radicals. As these radicals react, they deposit form thin films on the semiconductor substrate 10, including the amorphous carbon liner 20 as described herein.

The plasma 84 within the chamber 72 can be sourced either capacitively or inductively.

In various embodiments, the RF generator 80 may be a single RF generator or multiple RF generators capable of generating high, medium and/or low RF frequencies. For example, in the case of high frequencies, the RF generator 80 may generate frequencies ranging from 2-100 MHz and preferably 13.56 MHz or 27 MHz. When low frequencies are generated, the range is 50 KHz to 2 MHz, and preferably 350 to 600 KHz.

The system controller 82 is employed to control operation of the PECVD tool 70 in general and process conditions during deposition, post deposition, and/or other process operations. The controller 82 typically includes one or more non-transient computer readable medium devices for storing system control software or code computer and one or more processors for executing the code. The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. The processor may include a CPU or computer, multiple CPUs or computers, analog and/or digital input/output connections, motor controller boards, etc.

In certain embodiments, the controller 82, running or executing the system software or code, controls all or at least most of the activities of the tool 70, including such activities as controlling the timing of the processing operations, frequency and power of operations of the RF generator 80, pressure within the processing chamber 72, flow rates, concentrations and temperatures of gas(es) into the process chamber 72 and their relative mixing, temperature of semiconductor substrate 10 supported by the substrate holder 76, etc.

The controller 82 may also include a user interface (not shown). The user interface may include a display screen, graphical software displays of indicative of operating parameters and/or process conditions of the tool 70, and user input devices such as pointing devices, keyboards, touch screens, microphones, etc., that allow a human operator to interface with the tool 70.

Information transferred between the system controller 82 and the various components of the tool 70 may be in the form of signals such as electronic, electromagnetic, optical, or other signals capable of being transmitted and/or received via any communication link that carries signals and may be implemented using wire or cable, fiber optics, a phone line, a cellular phone link, a radio frequency link, and/or other communication channels.

It also should be noted that the PECVD tool may also be modified to perform the various etch steps, including the vertical etching of the features 14, and possibly the optional the etch-back and the conformity etches.

Deposition of Amorphous Carbon Liner

A wide variety of process flow and can be used within either a dedicated PECVD tool and/or a dual-purpose etch and PECVD tool to deposit the amorphous carbon liner 20 on the sidewalls 18 of the features 14. Such process flows involve defining within the processing chamber a temperature range, a pressure range, how the plasma is source, controlling flow rates of gases into the processing chamber, and the actual precursors and other chemistries actually used within the processing chamber.

In the Table I provided below, the exemplary examples and/or ranges are provided for each of the parameters listed above are provided. By using these examples and/or ranges, a PECVD process can be used to deposit the amorphous carbon liner 20 on the sidewalls 18 of the features 14.

TABLE I

| Process Parameter | Ranges/Examples/Comments |
|---|---|
| Substrate Temperature: | −60° to 700° C. |
| Pressure: | 50 milli-Torr to 10 Torr |
| Plasma Source: | Inductive or Capacitive |
| Precursor(s): | Hydrocarbons such as propylene, acetylene, methane, toluene and/or other hydrocarbon (CxHy) chemistries. |
| Other reactant chemistries: | Argon, helium, nitrogen. |
| Flow rates: | 0.1 to 10 Standard Liters Per Minute (SLMs) |
| Duration of deposition: | Can range to a few seconds to a number of minutes. Highly dependent on a wide variety of factors including desired vertical depth, desired aspect ratio and/or shape of feature 14, CD tolerance, type of deposition tool |

By no means should any of the information provided in the Table above be construed as limiting. On the contrary, it should be understood that the various ranges, examples, and factors used to define the duration of a given deposition are merely exemplary. Other ranges, examples and factors can be used for the deposition of the amorphous carbon liner 20 as needed to meet particular design objectives and process parameters.

Amorphous Carbon

Amorphous carbon, deposited to form the liner 20 on the sidewalls 18 of features 14, is preferably a free, reactive carbon that has no to little crystalline structure. Amorphous carbon materials may be stabilized by terminating dangling. π bonds with hydrogen. Amorphous carbon is often abbreviated to "aC" for general amorphous carbon, "HAC" for hydrogenated amorphous carbon, or to "ta-C" for tetrahedral amorphous carbon, sometimes referred to as diamond-like carbon. Within the context of the present application, any of these types of amorphous carbons may be used for defining the liner 20 on the sidewalls 18 of the features 14.

The properties of the amorphous carbon liner 20, as used herein, vary depending on the parameters used during deposition. The primary method for characterizing amorphous carbon is through the ratio of $sp^2$ to $sp^3$ hybridized bonds present in the material. Graphite consists purely of $sp^2$ hybridized bonds, whereas diamond consists purely of $sp^3$ hybridized bonds. Materials that are high hybridized bonds are referred to as tetrahedral amorphous carbon, owing to the tetrahedral shape formed by $sp^3$ hybridized bonds, or as diamond-like carbon (owing to the similarity of many physical properties to those of diamond). In addition, the amount or degree of hydrogen in the in the amorphous carbon liner 20 can be readily measured using spectrometry, for example, Rutherford Backscattering Spectrometry (RBS). The ability to detect levels of hydrogen is particularly beneficial when performing steps to densify the amorphous carbon liner 20 as described above.

Feature Characteristics/Dimensions

By using the iterative two step process (a) and (b) as described herein, semiconductor substrates with deep etch features, extremely high aspect ratios, and very tight CD control can be realized. For example, features 14 having depths of four (4) microns or more, aspect ratios of greater than or equal to (50:1) and tight CDs in the range of 80-100 or 150 nanometers or less, can be realized. It should be understood that these characteristics are merely exemplary.

Features 14 can be fabricated with vertical depths that are deeper or less deep, with larger or smaller aspect ratios and/or tighter or less tight CD measurements. As a general rule however, as semiconductor fabrication technologies improve, and the demand for ever more dense semiconductor devices continues, features 14 that are deeper, have higher aspect ratios and even tighter CD measurements are likely to be realized using the subject matter as described herein.

Simultaneous Deposition and Etching

As noted above, pinch off of the opening defining a feature 14 may be an issue for at least two reasons, including (1) possibly preventing etchant chemistries from reaching the depth of a feature when etching to deepen the feature and (2) possibly preventing amorphous carbon from depositing on the sidewalls 18 of features 14 when forming and/or replenishing the liner 20. Steps to avoid pinch off conditions are therefore advantageous because it possibly enables (3) the liner 20 to be more uniform in thickness from top to bottom, which in turn, (4) allows a subsequent etch to deepen the feature 14 to continue longer than otherwise possible, before the liner 20 is depleted, while maintaining tight CD control.

Figure 6:
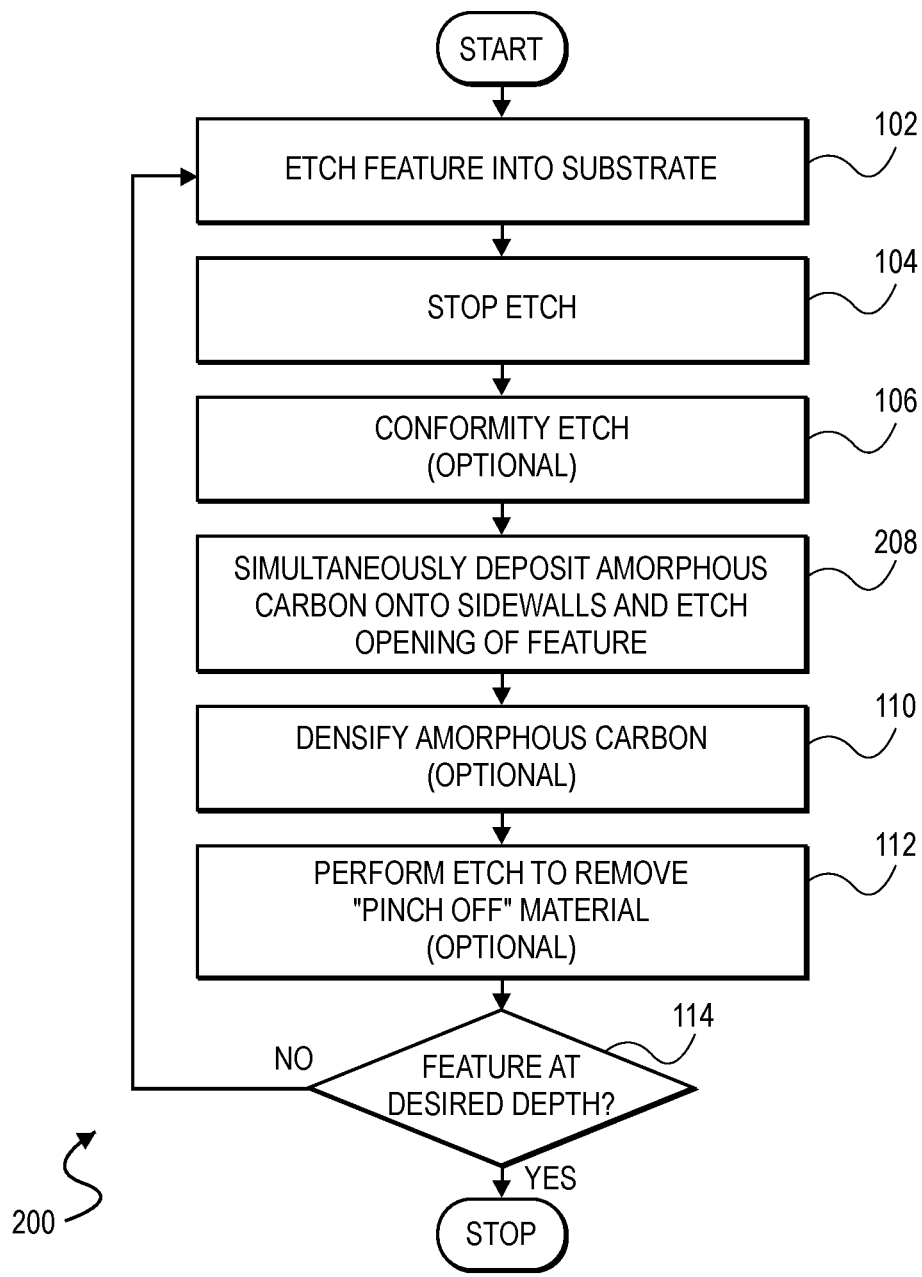
FIG. 6 is flow diagram illustrating processing steps for fabricating one or more features on a semiconductor substrate in accordance with another non-exclusive embodiment of the present invention.

Referring to FIG. 6, a flow diagram 200 illustrating a process flow in accordance with another non-exclusive embodiment for fabricating a feature 14 on a semiconductor substrate is illustrated. With this embodiment, the steps 102, 104 and optional steps 106, 110, 112 and decision step 114 are essentially the same as previously described. A repeat explanation of these steps is therefore not provided herein for the sake of brevity.

Step 208 differs from previously described step 108 in that amorphous carbon material that deposits at the opening and upper regions of the feature 14 is simultaneously etched while the deposition of the liner 20 is occurring. By performing the simultaneous etch, pinch off conditions during the deposition are either prevented altogether or at least delayed. As a result, the opening defining the feature 14 remains open either for the entire duration of the deposition or for a longer period of time before pinch off would otherwise occur, preventing or delaying the opening from being clogged with excess amorphous carbon material. As a result, the liner 20 on the sidewalls 18 is more uniform in thickness from top to bottom of the feature 14 (relative to if the simultaneous etch was not performed). With a more uniform liner 20, subsequent etches to deepen the feature 14 can continue for a longer period of time, before the liner 20 is depleted, while maintaining tight CD control.

As used herein, the term simultaneous should be broadly construed. In various embodiments, simultaneous may mean the etch is performed for the entire duration of the deposition. In other embodiments, simultaneous means the etch is performed for only a portion or fraction of time during which the deposition was performed.

Step 208 is implemented by introducing an etchant gas into the processing chamber 72 while the deposition is ongoing. As previously described, the deposition of the amorphous carbon liner 20 on the sidewalls is performed by introducing a carbon containing reactant (e.g., hydrocarbons such as propylene, acetylene, methane, toluene and/or other hydrocarbon (CxHy) chemistries) into the processing chamber and controlling the temperature range, the pressure range, plasma source, etc., as described above. At least partially simultaneously, an etchant chemistry is also introduced into the chamber as well, such as oxygen ($O_2$), nitrous oxide ($N_2O$), carbon dioxide ($CO_2$), hydrogen ($H_2$), and/or any other inert gas, or any mixture or combination thereof. Thus, as the amorphous carbon is deposited forming the liner 20 on the sidewalls 18 of a feature 14, the etchant simultaneously acts to remove excess deposits of the amorphous carbon from collecting at the opening and upper regions of the feature 14. Consequently, pinch off conditions are avoided altogether or are at least delayed, preventing the opening from becoming wholly or partially blocked later than otherwise would occur without the simultaneous etch. In various embodiments, the etch may occur during the entire time of the liner deposition or some simultaneous portion or fraction thereof.

In non-exclusive embodiments, the etch preferably is localized at the opening and a depth of only a few hundred nanometers (e.g., 50-400 nanometers) of the feature 14, which may be several microns or more deep. A number of factors or parameters can be managed within the processing chamber 72 during the amorphous carbon deposition to control the rate and depth of the simultaneous etch. For instance:

(1) The power of the plasma within the processing chamber can be set to be relatively low, meaning adequate to cause the etchant chemistry to break up into radicals. For instance if the etchant chemistry is carbon dioxide ($CO_2$), the power can be just sufficient to break up the carbon dioxide into carbon monoxide (CO) and oxygen (O) radicals. In various embodiments, the power can range from approximately 25 Watts to 1 KWatts;

(2) Certain radicals, such as mono oxygen (O), have a nuclear structure that makes them highly conducive to combining with other elements. As a result, the radicals have a relatively short life span, which effectively means their ability to diffuse downward into the depths of a feature 14 and etch amorphous carbon on the liner 20 beyond more than a few hundred nanometers in depth is limited;

(3) By controlling the pressure within the chamber to be relatively high range (e.g., within a range of 50 milli-Torr to 10 Torr for example), the reactive ions have a relatively low Ion Angle Distribution Function ("IADF"). As a result, the vast majority of the ions will contact the amorphous carbon at or near the opening and upper regions of the sidewalls 18 of the feature 14, while very few reactive ions will have the ability to diffuse downward into the depths of the feature 14 beyond a few hundred nanometers deep (e.g., 400 nanometers);

(4) The etch is predominately chemical, meaning the radicals such as mono oxygen (O) or carbon monoxide (CO), immediately react when coming into contact with the amorphous carbon liner 20, as opposed to bouncing off the sidewalls and diffusing deeper into the feature.

Each of the above factors helps contribute to limiting the depth of the etch. In different circumstances, the depth of the etch may vary, largely depending on the critical dimension of a given feature 14. For instance, with a feature 14 having a relatively small critical dimension (e.g., 50 nanometers), the depth of the etch will tend to be less because radicals are much more likely to contact a surface and react compared to a feature 14 with a larger critical dimension. With a feature 14 having a larger critical dimension, the chance of at least some radicals reaching a deeper level before contacting amorphous carbon on the liner 20 is larger. Hence, the larger the critical dimension of a given feature 14, generally the deeper the etch will likely be.

The rate of the etch is also highly controllable or "tunable". By controlling the flow rate of the etch chemistry into the processing chamber 72, the concentration of the radicals in the chamber can be largely managed. Thus, if a high rate of etching at the opening and upper regions of a feature is desired, then more etchant chemistry is introduced into the processing chamber. On the other hand, if a slower, more deliberate, etchant rate is desired, then less etchant chemistry is introduced. In various embodiments, the flow rate may range from 50 Standard Cubic Centimeters per Minute (SCCM) to 15 Standard Liters per Minute (SLM). It is noted that these flow rates are merely exemplary. Flow rates that are higher or lower may also be used.

Regardless of the rate, by-products are generated by the simultaneous etch. These by-products are typically removed by applying a vacuum pump to the processing chamber 72.

In one-nonexclusive embodiment, the most or all of the process flow depicted in FIG. 6 is performed within the processing chamber 72 of the substrate processing tool 70 and operations are controlled by the system controller 82. In other embodiments, the various steps of the process flow of FIG. 6 are performed in different process tools and/or process chambers. For instance, the steps 102/104 can be performed in one process chamber, while the step 208 as described herein is performed in another process chamber. The two process chambers can be included either in two separate tools or a single tool having two chambers. In either case, the substrate being processing needs to be transported between the two chambers.

The simultaneous etch during deposition of the amorphous carbon liner 20 has a number of benefits. By maintaining the opening and preventing the liner 20 in the upper regions of the sidewalls 18 from getting too thick, a subsequent etch step 102 to deepen the feature can be extended, while maintaining tight CD control. In addition, optional step 112 of performing a non-simultaneous etch is needed less often. For instance, instead of performing step 112 following every deposition step, it can be performed every second or third deposition step.

Figure 7A:
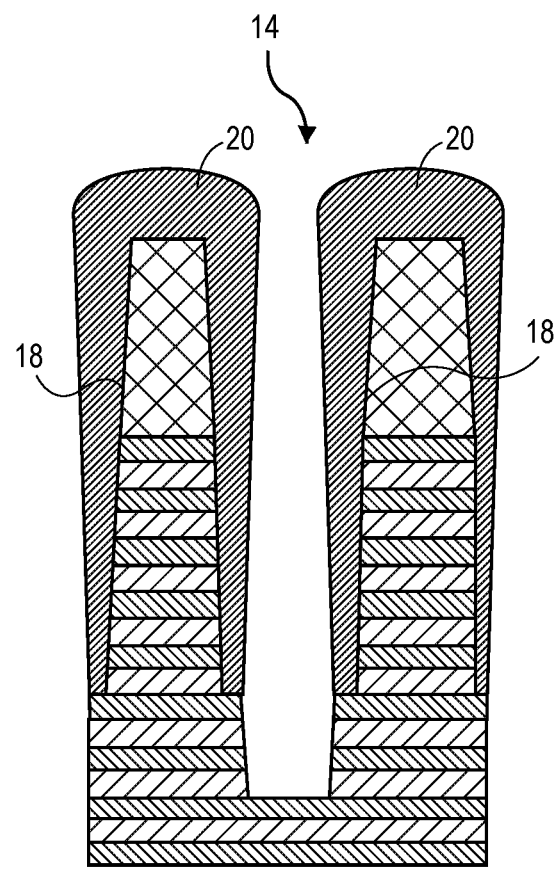
FIG. 7A and FIG. 7B are illustrate a feature pre and post a simultaneous etch and deposition of amorphous carbon material on a liner of sidewalls of an etched feature in accordance with a non-exclusive embodiment of the invention.
Figure 7B:
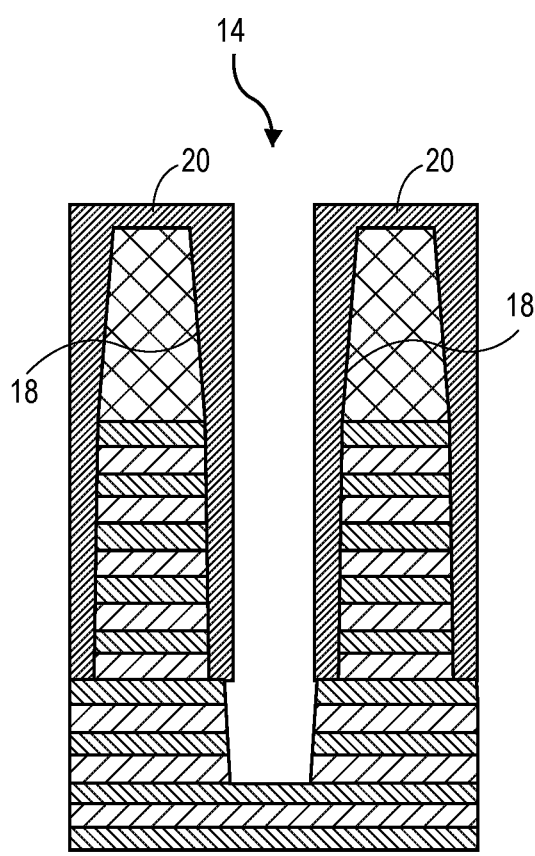

Referring to FIGS. 7A and 7B, a feature 14 with an amorphous carbon liner 20 is shown. In FIG. 7A, no simultaneous etch was performed. As a result, the amorphous carbon liner 20 is non-uniform in thickness and the opening defining the recess 14 is partially closed. In contrast, the FIG. 7B shows a similar feature 14 where the simultaneous etch was performed. As is evident by a comparison between the two features, the opening is larger and the thickness of the amorphous carbon liner 20 is more uniform in the FIG. 7B example.

The "co-flow" of a deposition precursor with an etchant chemistry thus provides a number of advantages. The etching prevents or reduces the growth of the amorphous carbon material at the opening and top regions of the liner 20 of a given feature 14, while still allowing the same liner deposition to occur deeper into the feature 14. The net result is an improvement in the thickness uniformity of the liner 20 from the top to the bottom of the feature, meaning the liner 20 in the lower regions of the feature 14 can be made thicker before pinch off at the opening and/or upper regions of the feature occurs. As a result, the subsequent etch to deepen the feature 14 can be performed for a longer duration of time before the liner 20 is depleted and needed to be replenished.

Mask Shaping and Pinch Off Material Removal

In yet another embodiment, steps can be performed to shape the mask used to define a feature 14 and also remove excess pinch off material that may have accumulated in the opening defined by the mask. With this embodiment, a carbon mask is formed and patterned on a semiconductor substrate. Thereafter, the feature 14 is fabricated, as described above, by (a) performing the starter or nominal etch, using the mask, to define the feature 14, (b) depositing the amorphous carbon liner 20 onto the sidewalls 18 of the feature and iterating (a) and (b) as needed until a desired depth and critical dimension is achieved. This embodiment introduces an additional step (c), which involves performing a mask-shaping etch of the carbon mask to define the opening of the feature. In preferred, although not required embodiments, (a), (b) and (c) are iterated two or more times until the feature has reached as desired depth. The purpose of each iteration of the mask-shaping etch (c) is to (i) remove excess deposits of the liner material that has collected in the opening of the feature defined by the carbon mask and (ii) shape the carbon mask in the vicinity of the opening of the feature. With (i) and (ii), the subsequent iterations of vertical etching (a) and sidewall liner deposition (b) are facilitated.

Process Flow Diagram

Figure 8:
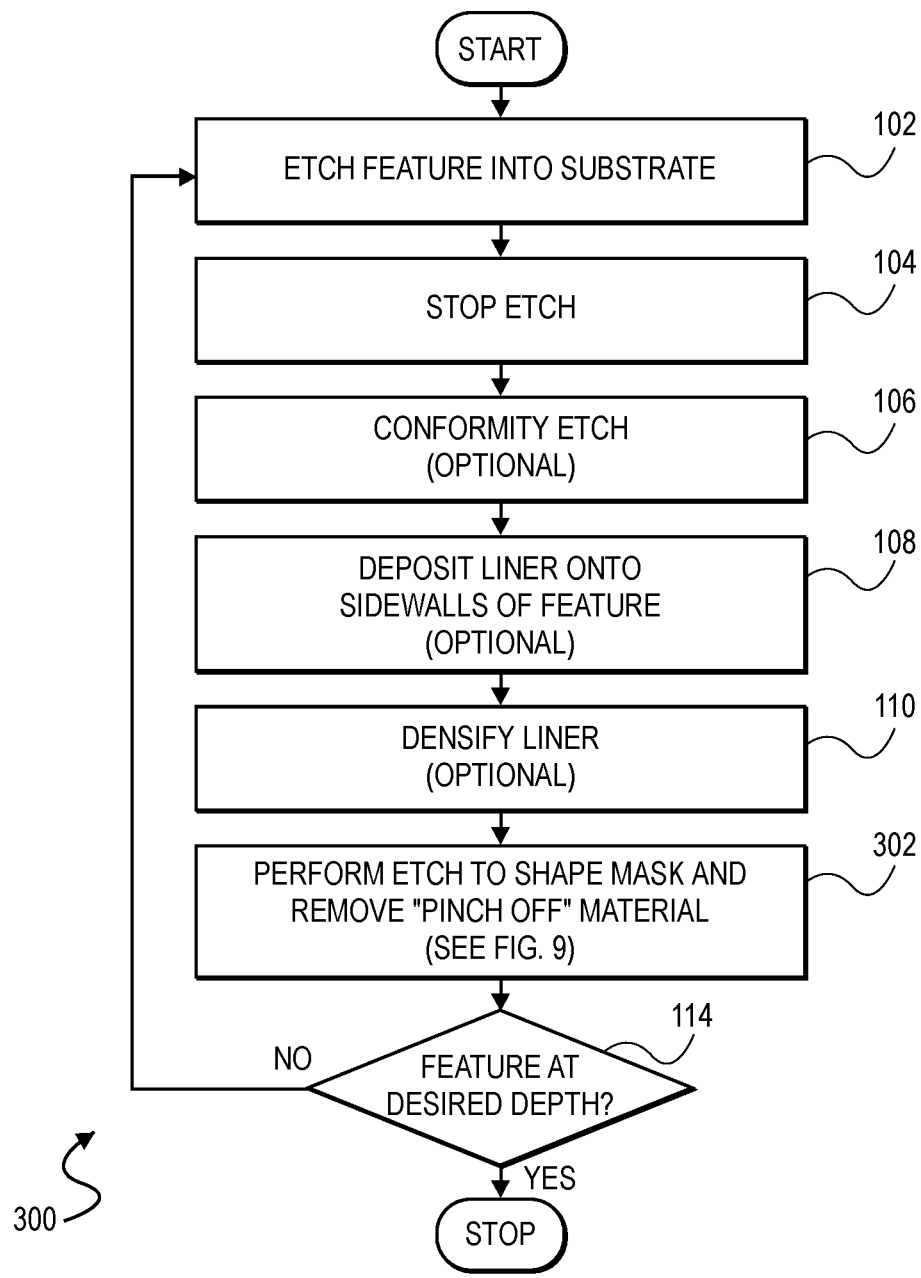
FIG. 8 is a flow diagram for fabricating a very high aspect ratio feature, with tight Critical Dimension ("CD") control, in accordance with a non-exclusive embodiment of the invention.

Referring to FIG. 8, a flow diagram 300 illustrating the processing steps (a), (b), and (c) one or more times for fabricating a vertical feature 14 on a semiconductor substrate is shown. Steps 102, 104, 106, 108, 110, and decision 114 are substantially the same as previously described. Hence, an explanation of these steps is not repeated herein for the sake of brevity.

In step 302, a mask etch for feature 14 is performed for the purpose of:
(i) Removing excess deposits of the amorphous carbon material that may have collected or otherwise deposited in the opening in the mask defining the feature during the liner deposition step 108; and
(ii) Shaping the carbon mask defining the opening of the feature.

By performing (i) and (ii), a subsequent iteration of the vertical etch (a) in step 102 and sidewall liner deposition (b) in step 108 are more effective because etchant and deposition material have unobstructed access to the sidewalls and depth of the feature. Further details of a non-exclusive embodiment of the mask etch are described below with regard to FIG. 9.

In step 114, it is determined if the feature has been vertical etched to its desired depth. If yes, then the above-described process is complete. If not, the above steps 102, 104 and 302, and possibly optional steps 106, 108 and 110, are repeated.

Mask Etch Step

As discussed above, the mask etch step 302 is performed to (i) remove excess deposits of the liner material that may have collected in the opening of the feature and (ii) shape the carbon mask in the vicinity of the opening of the feature. By shaping the mask, and removing unwanted deposits, it is easier in subsequent iterations of (a) and (b) for etchant chemistries and deposition material to enter into and reach the depth of the features. As a result, features with high aspect ratios, and tight CD control, can be achieved.

Figure 9:
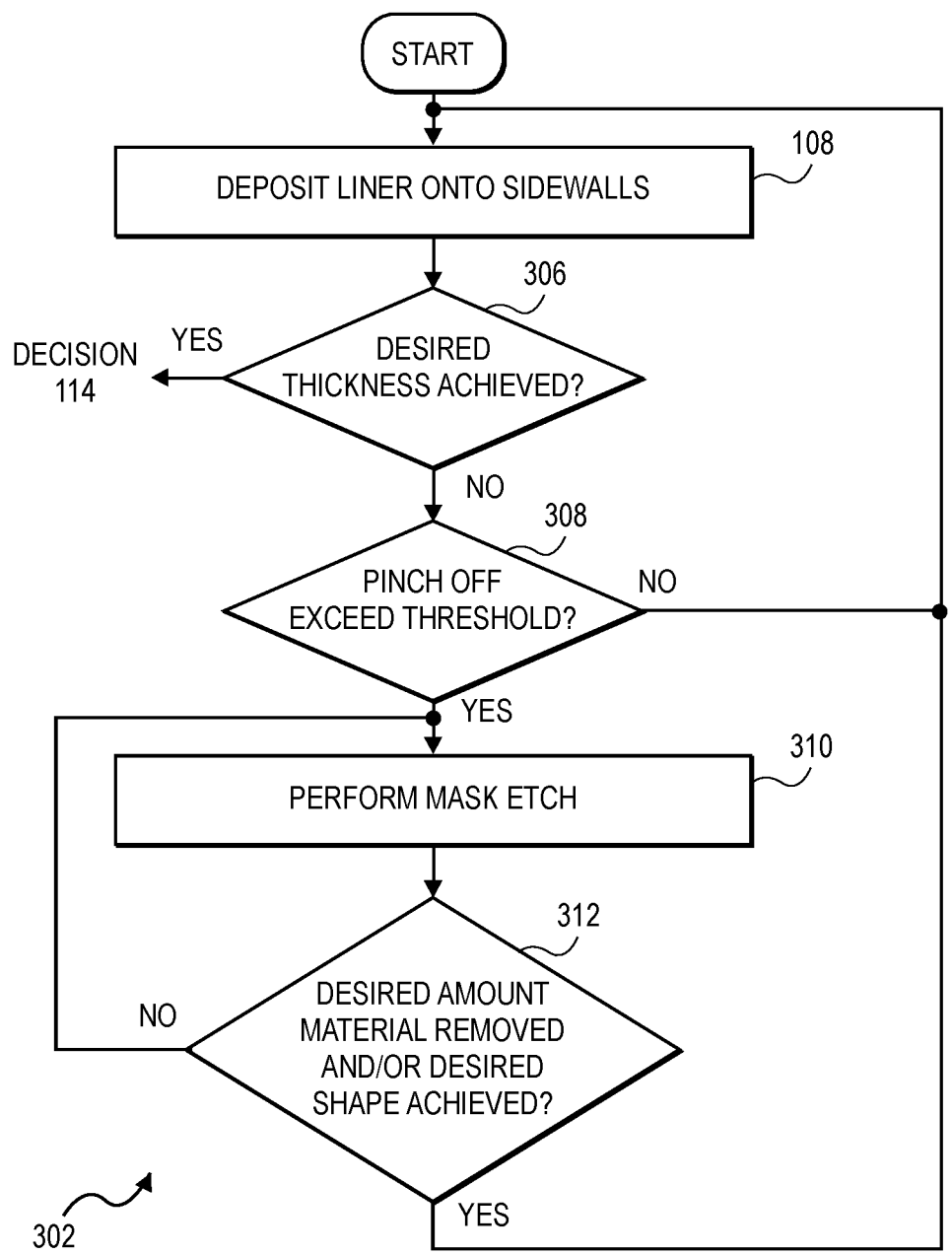
FIG. 9 is a flow diagram illustrating processing steps for shaping an opening defining a feature formed in a semiconductor substrate in accordance with a non-exclusive embodiment of the present invention.

FIG. 9 is flow diagram illustrating the individual steps of the mask etch step 302 of FIG. 8. Step 302 is performed while the deposition step 108 is ongoing. As the sidewall deposition is occurring, two individual inquiries are performed in parallel.

First, in decision 306, it is determined if the liner 20 on the sidewalls 18 of the feature 14 has been deposited to a desired thickness.

Second, in decision 308, it is also determined if the amount or degree of "pinch off", caused by excess deposits of the liner material that may have collected in the opening of the feature 14, has exceeded a threshold. In various embodiments, the threshold can be defined as a partial (e.g., a defined percentage) or a complete blockage of the opening.

If the liner 20 has reached a desired thickness without the pinch off material exceeding the threshold, then control is returned to the decision step 114 of FIG. 8.

On the other hand, if the pinch off of material exceeds the threshold before desired thickness of the liner 20 is reached, then a mask etch is performed.

In step 310, the mask etch is performed to remedy the pinch off condition that is partially or fully blocking or closing the opening defining the feature 14. Also, by shaping or tapering the mask, it is more conducive for both sidewall deposition material and etchant chemistries in subsequent iterations to flow into the depth of the given feature 14. In accordance with various embodiments, the mask etch may be performed using a number of different chemistries, including but not limited to nitrous oxide ($N_2O$), carbon dioxide ($CO_2$), oxygen ($O_2$), hydrogen ($H_2$), or any mixture or combination thereof.

In decision 312, it is determined if the desired amount of pinch off material has been removed and/or if the desired shape of the mask has been achieved. If not, then step 310 continues. If yes, then control returns to the step 302.

In various non-exclusive embodiments, the amount of material to be removed may range from approximately 2 to 50 nanometers. In addition, the desired shape of the mask is typically tapered, meaning the opening in the mask is wider at the top but narrows toward the opening of the feature 14.

The FIG. 9 flow diagram thus defines a secondary control loop that is embedded within the main control loop that is depicted in FIG. 8. In other words, one or more iterations of the main control loop of FIG. 8 may be performed, and for any given iteration of the main control loop, one or more iterations of the secondary loop may be performed.

Exemplary Semiconductor Substrate with Mask Shaping

Referring to FIG. 10A, an exemplary semiconductor substrate 10 with one (or more) layer(s) 42 is illustrated (for the sake of simplicity, only a single layer is shown). In addition, multiple features 14 are etched into the one (or more) layer(s) 42 formed on the substrate 10. As is well known in the semiconductor arts, features 14 are etched by forming a mask (not shown) on the layer(s) 42, patterning the mask layer to expose regions to be etched, and then exposing the substrate to an etchant chemistry in either a wet or dry etching process. With exposure to the etchant, portions of the underlying layer(s) 42 are removed or etched away resulting etched features 14, while the non-exposed regions that remain covered by the mask are not etched.

FIGS. 10B and 10C show a pre and a post mask etch step 302 respectively.

As illustrated in FIG. 10B, an exemplary feature 14 is illustrated. The feature 14 is characterized by a liner 20 formed on the sidewalls 18 of the feature 14, a mask 350 defining an opening 352 for the feature 14, and "excess 'pinch off'" material 354 formed at and just below the opening 352.

FIG. 10C shows the same feature 14 post mask etch step 302. As evident in the diagram, the pinch off material 354 is substantially removed from the vicinity of the opening 352. In addition, the shaped of the mask 350 has been tapered from wider to narrower in the direction toward the feature 14. By tapering the mask 350 and removing the excess pinch off material 354, the opening defining the feature is largely unobstructed, allowing both etchant chemistries and amorphous carbon to free enter the feature 14 and diffuse downward. As a result, subsequent iterations replenish the liner 20 result in a more uniform thickness, which means an subsequent etchings can be performed for a longer period of time before the liner 20 needs to be replenished, and the etchant chemistry can reach and etch deeper into the feature 14, both of which result in tight CD control.

In various embodiments, the deposition of the liner 20 on the sidewalls is amorphous carbon or any of the other carbon-containing materials or films listed above and the mask 350 is an ashable hard mask, such as amorphous carbon or other mask materials, such as metal doped carbon masks, pure metal masks and/or a polymer mask.

Mask Shaping and Pinch Off Removal Etch

In Table II provided below, the exemplary values and/or ranges are provided for a number of the parameters that may be implemented in a processing chamber of a tool for performing the mask etch. By using these values and/or ranges, an etch process can be used to both shape the mask 350 as well as remove excess deposition material at the opening 352 of the feature defined by the mask.

TABLE II

| Process Parameter | Ranges/Examples/Comments |
| --- | --- |
| Substrate Temperature: | −60° C. to 550° C. |
| Pressure: | 5 millitorr to 6 torr |
| Plasma Source: | Inductive or Capacitive |
| Precursor(s): | nitrous oxide ($N_2O$), carbon dioxide ($CO_2$), hydrogen ($H_2$), sulfur hexafluoride ($SF_6$), oxygen ($O_2$), or other oxygen containing species or a combination thereof. Also, other diluents can be used, such as inert gases including but not limited to nitrogen ($N_2$), helium (He), and/or argon (Ar). |
| RF | 13.56 MHz or anywhere in the range of 400 KHz to 60 MHz. |
| Flow rates: | 5 standard cubic centimeters per minute (sccm) to 10 standard liter per minute (slm) |
| Plasma wattage | 100 Watts or anywhere in the range of 25 Watts to 1 KWatts. |
| Duration of etch: | 5 seconds to 300 seconds |
| Amount of material removal | 2 to 50 nanometers |

The above-defined process parameters result in the use of a chemistry that enables the "gentle" etching of carbon, in a highly controlled manner. By generating a relatively low power plasma, oxygen and/or other radicals (e.g. carbon or nitrogen) form a volatile etchant that reacts with the carbon of the liner 20 at the top or opening of the feature 14. At high RF, the ion energy bombarding the surface of the mask 350 is relatively low, resulting in a relatively slow etch rate. The etch is therefore predominately a chemical etch. Most of the radicals immediately react when contacting the pinch off material, resulting in an etching byproduct that is pumped out of the processing chamber. Since the radicals have low energy, and tend to react immediately with the pinch off material or with material of the liner 20 immediately below the opening 352 (e.g., 400 nanometers of depth or less), relatively few of the radicals have the opportunity to diffused downward into the depth of the feature. As a result, most of the liner 20 remains intact, largely unaffected by the etch to shape the mask 350 and remove the pinch off material 354 from the opening 352.

In addition, by using the above-listed chemistries, the etch tends to be non-isotropic As a result, the etch gently tapers the mask 350, removing excess deposition material from the opening 352, but generally does not penetration into the depth of the feature 14 itself. Consequently, the liner 20 on the sidewalls of the features 14 substantially remains intact and remains largely unaffected by the mask etch.

Etching and/or Deposition Tool Embodiments

In various-nonexclusive embodiment, the most or all of the process flow steps depicted in FIG. 1, FIG. 6, FIG. 8, and/or FIG. 9 can be performed within a single substrate processing tool capable of performing both deposition and etching operations. For example, the etching and deposition steps in the above-recited figures can be implemented in the processing chamber 72 of the substrate processing tool 70 depicted in FIG. 5 and controlled by the system controller 82.

In other embodiments, the various steps of FIG. 1, FIG. 6, FIG. 8 and/or FIG. 9 can be performed in different process tools and/or process chambers. For instance, the steps deposition steps can be performed in one process chamber, while the etch steps are performed in a different processing chamber. The two process chambers can be included either in two separate tools or a single tool having two chambers. In either case, the substrate being processing needs to be transported between the two chambers.

Post Vertical Etch Protective Layers

The vertically etch features 14 are highly suitable for fabricating 3D NAND structures within alternating stacked layers of material, such as interspersed oxide, nitride and polysilicon layers (sometimes referred to as an "ONO" or "OPO" structure). As previously noted, the ability to iterate the steps (a) and (b), as described above, typically results in features 14 with very high aspect ratios and very tight CD control.

Referring to FIG. 11, a diagram 400 after a feature 14 that has been vertically etched is illustrated. The etch feature 14 is further characterized by sidewalls 18 reaching down to a depth 16. In this non-exclusive embodiment, the feature 14 is etched within one or more layers 12 formed on semiconductor substrate 10. For the sake of simplicity, the individual layers 12 formed on the substrate are not illustrated, but as noted above, can be a stacked "ONO" structure or any other structure of stacked layers.

By using the semiconductor processes as described herein, features 14 can be fabricated with current semiconductor process technologies that are very deep, have very high aspect ratios and very tight CDs. As these processing technologies improve in the future, features 14 that are even deeper, have even higher aspect ratios, and even tighter CD control can be realized using the same or similar iterative steps (a) and (b) as described herein.

Once one or more features 14 is/are fabricated, the substrate typically undergoes further processing. This processing may involve a number of steps, such as fabricating additional features 14 stacked on top of existing features 14, forming one or more insulating films over the features 14, forming one or more conductive films over the features 14, fabricating vias or contacts above or adjacent to the features 14, fabricating transistors or other circuit components over the features 14, or fabricating any other features and/or components commonly used on semiconductor substrates. Often these subsequent steps may be harmful to or otherwise detrimental to the underlying features 14.

In a non-exclusive embodiment, additional processing steps may be taken to cover and protect the features 14. These steps typically include either depositing a layer over the entire feature 14 or creating a "plug" within the recess defined by the feature 14, or completely filling the entire feature 14. With either approach, the feature 14 is protected during subsequent processing steps. In non-exclusive embodiments, the layer and/or plug is typically sacrificial, meaning the layer or plug is first deposited to protect the feature 14 during subsequent processing, but is eventually removed after the over lying structures, films, layers, etc. are fabricated. In other embodiments, the layer and/or plug may be non-sacrificial.

Referring to FIG. 12, a diagram 410 illustrating an exemplary feature 14 protected by a layer 412 is shown. During the course of depositing the layer 412, material is also deposited within the depth of the feature 14. As a result, a plug 414 is formed in the upper region of the 14, while material 416 forms on the sidewalls 18 of the feature. The material 416 on the sidewalls 18 is typically non-conformal, meaning the deposits tend to be thinker at the top of the feature and gradually become thinner toward the depth 16 of the feature 14.

Referring to FIG. 13, a diagram 420 illustrating a plug 414 that is recessed within a feature 14 and non-conformal material 416 on the sidewalls 18 of the feature 14 is provided. As described in more detail below, this embodiment is realized by performing an etch to remove the layer 412 from the FIG. 12 structure.

In some circumstances, the sacrificial layer 412 may be desired or used, while in other circumstances just the plug 414 is desired or used. As a general rule, the party fabricating the semiconductor substrate, or the end customer, decides which option to use.

In a non-exclusive embodiment, the layer 412, plug 414 and non-conformal material 416 on the sidewalls 18 is amorphous carbon.

In various embodiments, the amorphous carbon can be either deposited in (1) a simultaneous deposition and etch similar as described in the Table I and Table II above or (2) a separate deposition step as described in Table I followed by a separate chemical etch back step as described in Table II above.

Simultaneous Amorphous Carbon Deposition and Etch

As taught above, the process parameters listed above in Table I, regardless if performed alone or with a simultaneous etch, are suitable for depositing the amorphous carbon. With some modifications, a very similar process can be utilized for the amorphous carbon deposition of the protective layer 412, the plug 414 and the non-conformal amorphous carbon material 416 formed on the sidewalls 18 of the features 14 as illustrated in FIG. 12 and FIG. 13.

In one embodiment, the deposition of amorphous carbon forming the layer 412, plug 414 and non-conformal material 416 on the sidewalls 18 occurs simultaneously with an etch of the deposited amorphous carbon. As noted above, the deposition of the amorphous carbon is accomplished by introducing one or more carbon containing precursors and then generating a plasma within the chamber using the parameters similar to those noted in Table I. Such carbon containing precursors include, but are not limited to, hydrocarbons such as propylene, acetylene, methane, toluene and/or other hydrocarbon (CxHy) chemistries.

The simultaneous etch is preferably, although not necessarily, a chemical etch. In non-exclusive embodiments, the etch is performed by simultaneously introducing an etchant gas into the processing chamber during the deposition, such as nitrous oxide ($N_2O$), carbon dioxide ($CO_2$), hydrogen ($H_2$), sulfur hexafluoride ($SF_6$), oxygen ($O_2$), other oxygen containing species, or a combination thereof. The chemical etch is simultaneously performed using the parameters similar to those noted above in Table II.

The deposit rate of the amorphous carbon is at least partially controlled by regulating the concentration levels of certain diluents introduced into the chamber during the simultaneous deposition and etch. Such diluents may include, but are not limited to inert gases, such as nitrogen ($N_2$), helium (He), and/or argon (Ar). For example, by using relatively high concentration levels of diluents, the deposition rate can be minimized. By reducing or altogether eliminating the diluents, the deposition rate can be increased. Thus, in situations where minimal to no deposition is desired, such as during a simultaneous deposition and etch to form a vertical etch feature (e.g., the FIG. 6 embodiments) having a high aspect ratio and a tight CD dimension, then higher concentration levels of diluents is desirable. On the other hand where the objective is to increase the deposition rate of the amorphous carbon, such as when forming sacrificial plugs and/or sacrificial non-conformal amorphous carbon on sidewalls, then lower or even no diluents is desirable. Thus, by adjusting the concentration levels of the diluents, such as inert gases, including but not limited to nitrogen ($N_2$), helium (He), and/or argon (Ar), the deposition rate of the amorphous carbon can be controlled to meet a wide variety of different objectives.

With the layer 412, plug 414 and non-conformal material 416 on the sidewalls 18, the objective is to deposit the amorphous carbon (i) in relatively thick layer, (ii) quickly and (iii) with some degree of non-conformity on the sidewalls 18 of the etch features 14. The Applicant has found that these objectives can be readily met by reducing or altogether eliminating the inert gases such as helium, nitrogen and/or argon in the plasma. In other words, by eliminating or adjusting down the levels of these inert gases in the processing chamber, either the plasma is no longer diluted or the dilution is controlled to a lesser degree. As a result, the rate of deposition of the amorphous carbon can be control to meet the three objectives (i) through (iii) noted above when forming layer 412, the plug 414 and the non-conformal material 416 on the sidewalls 18. It is further noted that the deposition occurs and is largely controlled by the concentration level of the diluents in spite of the fact that an etchant gas (e.g., $N_2O$, $CO_2$, $H_2$, $SF_6$, and/or $O_2$) is simultaneously flowing into the processing chamber as well. By controlling the diluents at low concentration levels, the deposition rate can be controlled to exceed the chemical etch rate, allowing the amorphous carbon to deposit and meet the three objectives (i) through (iii) identified above.

As mentioned above, some degree of non-conformity of the deposition of the amorphous carbon material 416 on the sidewalls 18 is generally desired. If the deposition rate is too low and/or too slow, then there is a possibility that the deposited amorphous carbon material 416 will be conformal (i.e., of uniform thickness), filling all or most of the recess 14. To avoid this issue, the amount of inert gases introduced into the processing chamber can be adjusted as needed to achieve a desired non-conformity as well as deposit the amorphous carbon material to form the plug 414 and/or the layer 412.

As previously described, either the embodiments of FIG. 12 or FIG. 13 may be desired or used. For circumstances when the FIG. 12 embodiment is used, no or minimal additional steps are typically required once the amorphous carbon deposition is complete for layer 412, plug 414 and the non-conformal material 416 on the sidewalls 18.

On the other hand if the FIG. 13 embodiment is preferred, then further etching is typically required to selectively remove some of the deposited amorphous carbon. In a non-exclusive embodiment, an oxygen or hydrogen or fluorine based etch can be performed in situ the same processing chamber in which the deposition of the layer 412, plug 414 and the material 416 was performed. In such embodiments, the amorphous carbon containing chemistry, such as propylene or acetylene, are dialed down or altogether removed from the processing chamber, while an oxygen or hydrogen or fluorine based chemistry is introduced into the chamber. As this transition occurs, the chamber changes from predominately a "deposition" chamber to predominately an "etching" chamber. In various embodiments, a number of different oxygen based chemistries may be used, including but not limited to nitrous oxide ($N_2O$), carbon dioxide ($CO_2$), oxygen ($O_2$), hydrogen (H2), sulfur hexafluoride (SF6), etc. The etch is performed using many of the process parameters provided in Table II above, but with certain parameters adjusted as needed. For instance the precursor(s) used can be limited to only those containing oxygen, the plasma wattage can be adjusted so that the etch is primarily chemical, and the duration can be adjusted as needed until the desired amount of amorphous carbon material is removed from the layer 412 and/or plug 414.

The FIG. 13 embodiment is achieved by etching the structure shown in the FIG. 12 embodiment. In other words, the etch is performed until the layer 412 is etched away and a portion of the plug 414 is etched away as well. With this arrangement, an opening or recess is provided immediately above the plug 414. But with the presence of the plug 414, the underlying etched feature 14 is protected.

Separate Amorphous Carbon Deposition and Etch Steps

In an alternative embodiment, the amorphous carbon deposition forming the layer 412, plug 414 and non-conformal material 416 on the sidewalls 18 can be performed in a first deposition step. Again, by controlling the concentration levels of any diluents, the deposition rate can be controlled as needed to meet the above-defined objectives (i) through (iii). Once the deposition is complete, then a separate etch step can be performed. The parameters used for both the deposition and the etch can be similar to those included in Table I and Table II respectively. The above-described etch can be performed in a second processing chamber different than where the amorphous carbon deposition was performed. In this latter embodiment, the semiconductor substrate 10 needs to be transported between the processing chambers, which may be located on the same tool or different tools.

Advantages of Amorphous Carbon

The use of amorphous carbon has a number of advantages. As discussed above, the deposition of amorphous carbon is easy to control. For instance, the thickness of the layer 412 can be deposited to just about any desired dimension. Also, the deposition of the amorphous carbon forming the material 416 on the sidewalls can also be controlled to be non-conformal, which is generally preferred in this application over a conformal layer that may fill the entire feature 14. Since the objective is to "plug" the feature 14, filling the entire feature with protective material is not necessary and may be problematic when later attempts are made to remove. A non-conformal etch is therefore typically preferred, but by no means is a requirement.

Another advantage realized by using amorphous carbon is that the material is "ashable", meaning it is readily removed. As described in more detail below, amorphous carbon can be readily removed with a gentle oxygen-based etch. With an oxygen-based etch, the amorphous carbon is essentially chemically removed in a very controlled manner, allowing for example, the removal of layer 412, while leaving plug 414 remaining (e.g., as shown in FIG. 13). Also, an oxygen-based etch is very gentle and will result in little to no damage to the vertically etched feature 14. By way of comparison, if other protective materials or layers were used such as boron, a very harsh and/or aggressive etch would be required for removal. Also, an ion bombardment assist may be needed. Either way, the use of non-amorphous carbon materials, such as boron, would greatly increases the chance of damaging to the etched features 14 and/or surrounding features and/or film layers.

Very often during the subsequent processing steps used to fabrication additional thin films and/or stacked structures, very high processing temperatures in excess of 800° C. are used. Yet another advantage to amorphous carbon is that it can withstand and remain intact at high temperatures in the 800° C. or higher range.

Although only a few embodiments have been described in detail, it should be appreciated that the present application may be implemented in many other forms without departing from the spirit or scope of the disclosure provided herein. Therefore, the present embodiments should be considered illustrative and not restrictive and is not to be limited to the details given herein, but may be modified within the scope and equivalents of the appended claims.

What is claimed is:

1. A method of fabricating a semiconductor substrate, the method comprising:
   (a) vertical etching a feature having sidewalls and a depth into one or more layers formed on the semiconductor substrate;
   (b) depositing an amorphous carbon liner onto the sidewalls of the feature; and
   (c) iterating (a) and (b), wherein with each iteration of (a), the depth of the feature is vertical etched deeper into the one or more layers, while the deposited amorphous carbon liner resists lateral etching of the sidewalls of the feature, and wherein with each iteration of (b), the deposited amorphous carbon liner on the sidewalls of the feature is at least partially replenished.

2. The method of claim 1, further comprising performing an etch-back etch to etch back one of the following:
   (i) incidental deposit of the amorphous carbon occurring on a planar surface of the one or more layers adjacent the feature;
   (ii) thicker regions, relative to thinner regions, of the amorphous carbon liner that forms on the sidewalls of the feature; or
   (iii) both (i) and (ii).

3. The method of claim 1, further comprising
   (d) densifying the amorphous carbon liner after depositing the amorphous carbon liner onto the sidewalls of the feature.

4. The method of claim 3, wherein iterating (a) and (b) further comprises iterating (d).

5. A method for fabricating a semiconductor substrate, the method comprising:
   (i) depositing an amorphous carbon material forming a liner onto sidewalls of a feature vertically etched into one or more layers on a semiconductor substrate;
   (ii) at least partially simultaneous etching, during the deposition of the amorphous carbon material, excess deposits of the amorphous carbon material depositing in a hole defining the feature and upper regions of the sidewalls of the feature; and
   (iii) after depositing the amorphous carbon material onto the sidewalls of the feature, performing additional vertical etching of the feature, wherein the amorphous carbon material resists lateral etching of the sidewalls of the feature during the additional vertical etching.

6. The method of claim 5, further comprising controlling the at least partial simultaneous deposition and etching so that the amorphous carbon material forming the liner is more uniform in thickness from a bottom of the vertically etched feature to the upper regions of the sidewalls of the feature, wherein the more uniformity in thickness is relative to a lack of uniformity of the thickness of the liner had the etch not been performed.

7. The method of claim 5, further comprising controlling the at least partial simultaneous deposition and etch so that "pinch off" of excess amorphous carbon material in an opening defining the feature is either delayed or prevented from occurring by the at least partially simultaneous etch during the deposition, wherein pinch off is defined as a complete or partial blockage of the opening.

8. A method of fabricating a semiconductor substrate, the method comprising:
   (a) vertically etching a feature having an opening, sidewalls and a depth into one or more layers formed on the semiconductor substrate;
   (b) depositing a liner material onto the sidewalls of the feature;
   (c) performing an etch of a carbon mask used to define the opening of the feature, the etch:
      (i) removing excess deposits of the liner material that has collected in the opening of the feature defined by the carbon mask; and
      (ii) shaping the carbon mask in a vicinity of the opening of the feature; and
   (d) iterating (a), (b) and (c) until the feature has reached a desired depth into the one or more layers formed on the semiconductor substrate.

9. The method of claim 8, further comprising performing (b) and (c) in a same chamber of a substrate processing tool.

10. The method of claim 8, wherein (a), (b), (c), and (d) are each performed by a same substrate processing tool.

11. The method of claim 8, wherein shaping of the carbon mask further
   comprises tapering the opening from wide to narrow in the direction toward the feature.

12. A method for fabricating a semiconductor substrate, comprising:
   fabricating a vertical feature into one or more layers formed on a substrate, the vertical feature having an opening, sidewalls and a depth; and
   depositing amorphous carbon onto the sidewalls of the vertical feature and within the opening so that the amorphous carbon is deposited non-conformally to be thinner near the depth of the vertical feature and thicker near the opening of the vertical feature, the amorphous carbon deposited in the opening forming an amorphous carbon plug in the opening of the vertical feature, wherein the amorphous carbon partially fills the vertical feature in a section below the amorphous carbon plug.

13. The method of claim 12, further comprising depositing additional amorphous carbon over the amorphous carbon plug formed in the opening of the vertical feature and on surface area of the one or more layers surrounding the vertical feature.

14. The method of claim 13, further comprising etching back the additional amorphous carbon deposited over the plug to create a recess above the plug.

15. A method performed within a substrate processing chamber, the method comprising:

fabricating a vertical feature formed on a substrate in the processing chamber, the vertical feature having an opening, sidewalls and a depth;

depositing amorphous carbon material on the substrate in the processing chamber, the amorphous carbon material deposited on the sidewalls of the vertical feature and forming a plug within the opening of the vertical feature, wherein the amorphous carbon material partially fills the vertical feature in a section below the plug, and wherein the amorphous carbon material is deposited non-conformally so that the amorphous carbon material is thinner near the depth of the vertical feature and thicker near the opening of the vertical feature; and etching back a portion of the plug to create a recess above the plug.

16. The method of claim 15, wherein fabricating the vertical feature further comprises (a) vertically etching the feature, (b) depositing an amorphous carbon layer on the sidewalls of the feature and (c) iterating (a) and optionally (b) one or more times until the vertical feature has reached the predetermined depth, wherein the deposition of the amorphous carbon layer during each iteration of (b) mitigates horizontal etching of the feature during a subsequent iteration of (a).

* * * * *